US012777985B2

(12) United States Patent
Lim et al.

(10) Patent No.: US 12,777,985 B2
(45) Date of Patent: Oct. 27, 2026

(54) SEMICONDUCTOR PACKAGE

(71) Applicant: SAMSUNG ELECTRONICS CO., LTD., Suwon-si (KR)

(72) Inventors: Jihyun Lim, Suwon-si (KR); Yoonyoung Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 255 days.

(21) Appl. No.: 18/757,626

(22) Filed: Jun. 28, 2024

(65) Prior Publication Data

US 2025/0079421 A1 Mar. 6, 2025

(30) Foreign Application Priority Data

Sep. 5, 2023 (KR) ........................ 10-2023-0117430

(51) Int. Cl.

| | |
|---|---|
| ***H10W 90/00*** | (2026.01) |
| ***H10D 1/68*** | (2025.01) |
| ***H10W 70/65*** | (2026.01) |
| ***H10W 70/685*** | (2026.01) |

(52) U.S. Cl.

CPC ............ *H10W 90/00* (2026.01); *H10D 1/692* (2025.01); *H10W 70/65* (2026.01); *H10W 70/685* (2026.01); *H10W 90/794* (2026.01)

(58) Field of Classification Search

CPC ............. H10W 70/685; H10W 90/794; H10W 20/495; H10W 20/496

See application file for complete search history.

(56) References Cited

U.S. PATENT DOCUMENTS

| | | | |
|---|---|---|---|
| 7,689,051 B2 | 3/2010 | Mukerjee | |
| 9,093,224 B2 | 7/2015 | Choi et al. | |
| 9,332,650 B2 | 5/2016 | Yoshioka et al. | |
| 10,026,678 B1 | 7/2018 | Cho et al. | |
| 10,083,929 B2 | 9/2018 | Choi et al. | |
| 10,763,217 B2 | 9/2020 | Lee et al. | |
| 10,790,239 B2 | 9/2020 | Lim et al. | |
| 11,285,700 B2 | 3/2022 | Yoneda | |
| 2016/0133686 A1* | 5/2016 | Liao | H01G 4/005 257/532 |
| 2019/0157108 A1* | 5/2019 | Liao | H10D 1/68 |

(Continued)

FOREIGN PATENT DOCUMENTS

| | | |
|---|---|---|
| KR | 10-2006-0045712 A | 5/2006 |
| KR | 10-2014-0075836 A | 6/2014 |

*Primary Examiner* — Benjamin P Sandvik

(74) *Attorney, Agent, or Firm* — Morgan, Lewis & Bockius LLP

(57) ABSTRACT

Provided is a semiconductor package including a first wiring structure, a second wiring structure disposed on the first wiring structure, an expanded layer electrically connecting the first wiring structure and the second wiring structure to each other, and including an expanded base layer and a plurality of via structures, a semiconductor chip disposed in the expanded layer and between the first wiring structure and the second wiring structure, and a buried capacitor structure including a plurality first through-holes spaced apart from each other that penetrate the expanded base layer adjacent to the semiconductor chip, and extend in a first horizontal direction along a side surface of the semiconductor chip, and a plurality of electrode layers disposed on sidewalls of the plurality of first through-holes.

20 Claims, 37 Drawing Sheets

(56) References Cited

U.S. PATENT DOCUMENTS

| | | | | |
|---|---|---|---|---|
| 2020/0135840 | A1* | 4/2020 | Chen | H10D 1/68 |
| 2022/0302007 | A1 | 9/2022 | Gangal et al. | |
| 2025/0233110 | A1* | 7/2025 | Shin | H10W 20/20 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2023-0117430, filed on Sep. 5, 2023, in the Korean Intellectual Property Office, the disclosure of which is incorporated by reference herein in its entirety.

TECHNICAL FIELD

The inventive concepts relates to a semiconductor package, and more specifically, to a Fan-Out Panel Level Package (FOPLP) and a package-on-package (POP) including the same.

DESCRIPTION OF RELATED ART

In accordance with the rapid development of the electronics industry and the demands of users, electronic devices are becoming more compact, multifunctional, and large-capacity. Highly integrated semiconductor chips have been proposed to meet these demands.

For highly integrated semiconductor chips with a number of connection terminals for input/output (I/O), a semiconductor package having connection terminals with secured connection reliability may be designed. For example, a fan-out semiconductor package, such as an FOPLP, may be developed to increase spacing between connection terminals, which may reduce or prevent interference between the connection terminals.

SUMMARY

The inventive concepts provide a semiconductor package with improved operational reliability.

According to an aspect of the inventive concepts, there is provided a semiconductor package including a first wiring structure, a second wiring structure disposed on the first wiring structure, an expanded layer electrically connecting the first wiring structure with the second wiring structure, and including an expanded base layer and a plurality of via structures, a semiconductor chip disposed in the expanded layer and between the first wiring structure and the second wiring structure; and a buried capacitor structure including a plurality first through-holes spaced apart from each other that penetrate the expanded base layer adjacent to the semiconductor chip, and extend in a first horizontal direction along a side surface of the semiconductor chip, and a plurality of electrode layers disposed on sidewalls of the plurality of first through-holes.

According to another aspect of the inventive concepts, there is provided a semiconductor package including a first wiring structure including a plurality of first redistribution patterns and a plurality of first redistribution insulation layers surrounding the plurality of first redistribution patterns, a second wiring structure disposed on the first wiring structure and including a plurality of second redistribution patterns and a plurality of second redistribution insulation layers surrounding the plurality of second redistribution patterns, an expanded layer electrically connecting the first wiring structure with the second wiring structure, and including an expanded base layer and a plurality of via structures, a semiconductor chip disposed in the expanded layer and arranged between the first wiring structure and the second wiring structure; and a buried capacitor structure embedded in the expanded base layer, wherein the expanded base layer has a pair of first through-holes spaced apart from each other, and at least one second through-hole disposed between the pair of first through-holes and spaced apart from the pair of first through-holes, each of the pair of first through-holes and the at least one second through-hole extends in a horizontal direction while passing through the expanded base layer adjacent to the semiconductor chip, and the buried capacitor structure includes a pair of electrode layers disposed on respective sidewalls of the pair of first through-holes, a hole plugging material layer made of an insulation material that covers each of the pair of electrode layers and is disposed in each of the pair of first through-holes, and at least one dielectric layer disposed in the at least one second through-hole and including a high-k dielectric material.

According to another aspect of the inventive concepts, there is provided a semiconductor package including a lower package including a first wiring structure including a plurality of first redistribution patterns and a plurality of first redistribution insulation layers surrounding the plurality of first redistribution patterns, a second wiring structure disposed on the first wiring structure and including a plurality of second redistribution patterns and a plurality of second redistribution insulation layers surrounding the plurality of second redistribution patterns, a lower semiconductor chip disposed between the first wiring structure and the second wiring structure, an expanded layer surrounding the semiconductor chip and including an expanded base layer and a plurality of via structures penetrating the expanded base layer to electrically connect the plurality of first redistribution patterns with the plurality of second redistribution patterns, and a buried capacitor structure embedded in the expanded base layer and electrically connected to the semiconductor chip, and an upper package attached to the second wiring structure, electrically connected to the plurality of second redistribution patterns, and including an upper semiconductor chip, wherein the expanded base layer includes a pair of first through-holes and at least one second through-hole that penetrate the expanded base layer adjacent to the semiconductor chip and respectively extend in a first horizontal direction along a side surface of the semiconductor chip, the pair of first through-holes are spaced apart from each other in a second horizontal direction perpendicular to the first horizontal direction, the at least one second through-hole is spaced apart from the pair of first through-holes, and is disposed between the pair of first through-holes, and the buried capacitor structure includes a pair of electrode layers conformally covering sidewalls of the pair of first through-holes, a hole plugging material layer made of an insulation material that covers each of the pair of electrode layers filling each of the pair of first through-holes, and at least one dielectric layer filling the at least one second through-hole and including a high-k dielectric material.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1A:
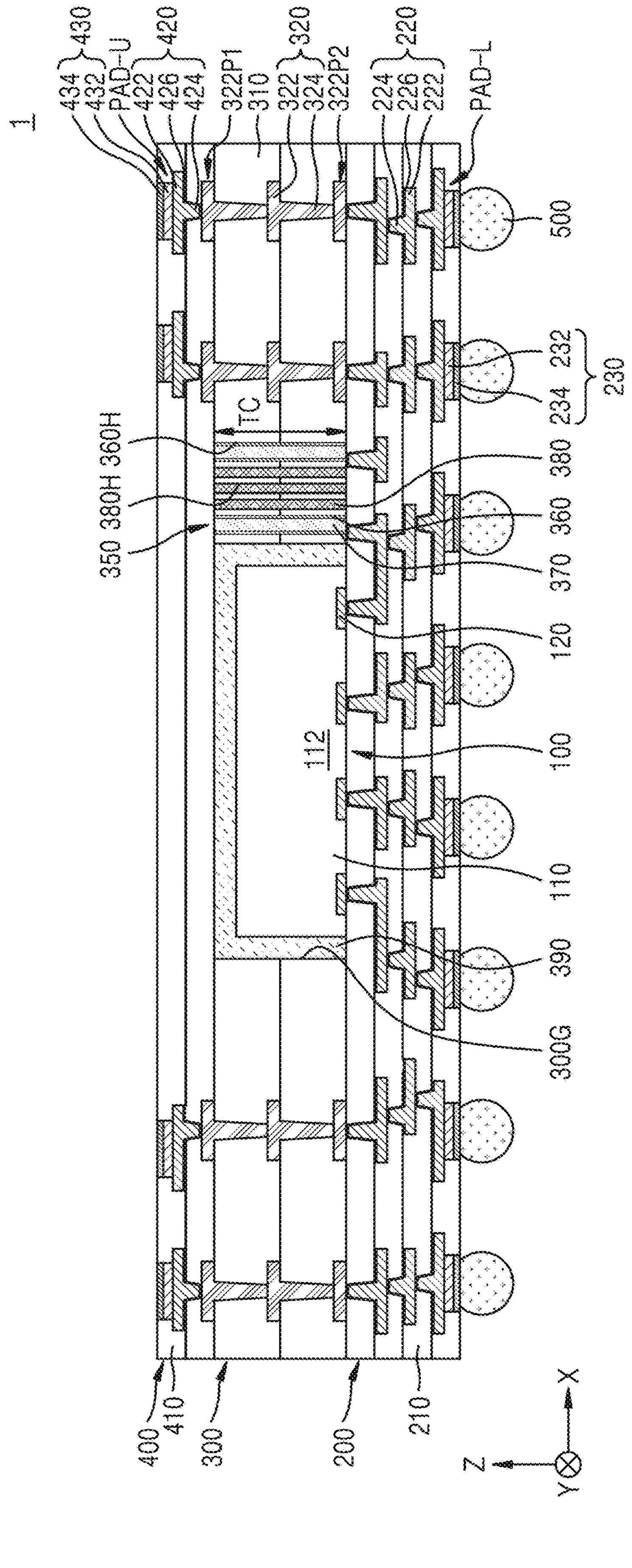
FIG. 1A is a cross-sectional view of a semiconductor package that is a fan-out panel level package, according to embodiments.

The inventive concepts may be implemented in various modifications and have various forms, and specific embodiments are illustrated in the drawings and described in detail in the text. It is to be understood, however, that the inventive concepts are not intended to be limited to the particular forms disclosed, but on the contrary, is intended to cover all modifications, equivalents, and alternatives falling within the spirit and scope of the inventive concepts.

In this specification, it will be understood that when an element (or region, layer, portion, or the like) is referred to as being "on", "connected to" or "coupled to" another element, it may be directly disposed/connected/coupled to another element, or intervening elements may be disposed therebetween.

Like reference numerals or symbols refer to like elements throughout. In the drawings, the thickness, the ratio, and the dimension of the elements may be exaggerated for effective description of the technical contents.

The term "and/or" includes all combinations of one or more of the associated listed elements.

Although the terms first, second, etc., may be used to describe various elements, these elements should not be limited by these terms. These terms are only used to distinguish one element from another element. For example, a first element may be referred to as a second element, and similarly, a second element may also be referred to as a first element without departing from the scope of the inventive concepts. The singular forms include the plural forms unless the context clearly indicates otherwise.

Terms such as "below", "lower", "above", "upper" or the like, may be used in the description to describe one element's relationship to another element illustrated in the figures. It will be understood that the terms have a relative concept and may be described on the basis of the orientation depicted in the figures.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

The following will now describe a semiconductor package, and more specifically, to a Fan-Out Panel Level Package (FOPLP) and a package-on-package (POP) including the same according to the present inventive concepts with reference to the accompanying drawings.

Figure 1B:
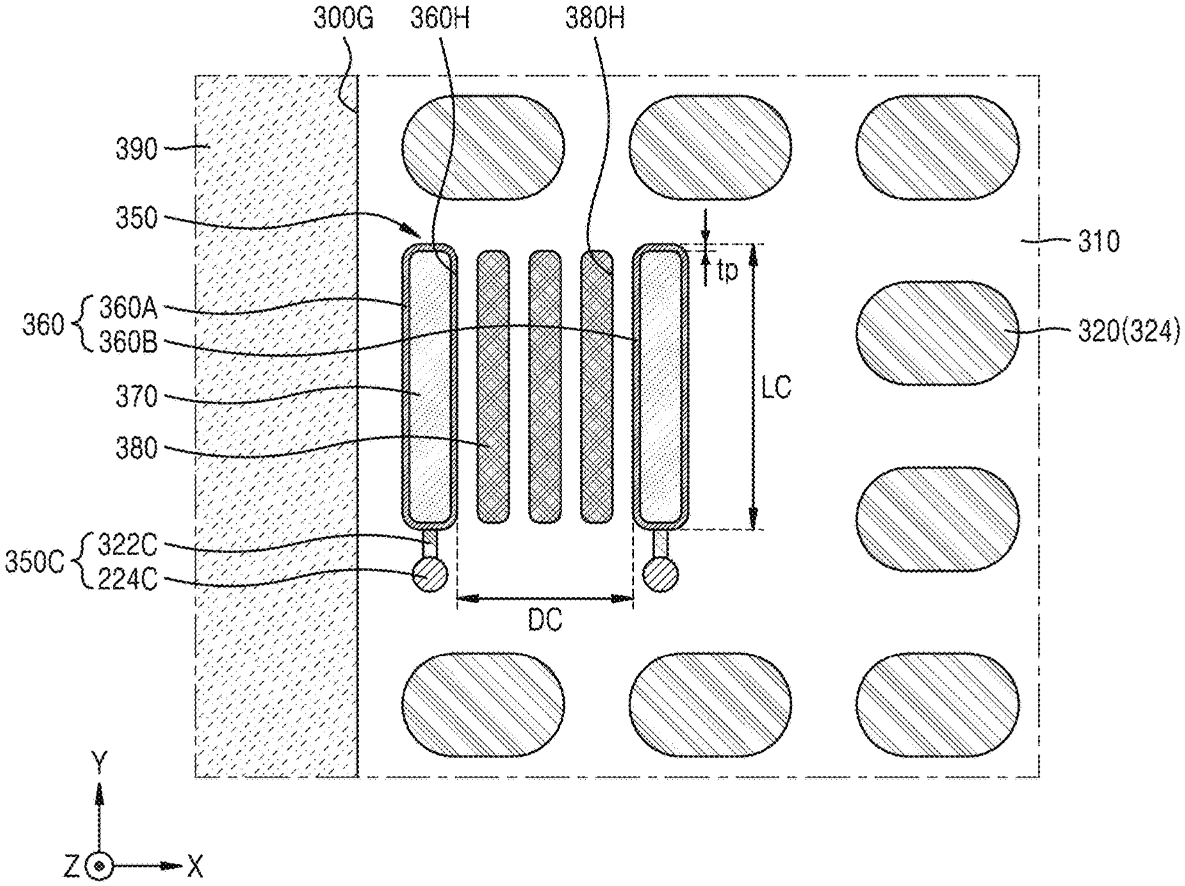
FIG. 1B is an enlarged plan view showing part of the semiconductor package of FIG. 1A.

FIG. 1A is a cross-sectional view of a semiconductor package that is a fan-out panel level package according to embodiments. FIG. 1B is an enlarged plan view showing a part of the semiconductor package of FIG. 1A.

Referring to FIG. 1A and FIG. 1B together, the semiconductor package 1 may include a first wiring structure 200, a second wiring structure 400, at least one semiconductor chip 100, and an expanded layer 300. The expanded layer 300 may electrically connect the first wiring structure 200 and the second wiring structure 400 with each other. The second wiring structure 400 may be disposed on the first wiring structure 200. The at least one semiconductor chip 100 may be arranged between the first wiring structure 200 and the second wiring structure 400. The expanded layer 300 may be arranged between the first wiring structure 200 and the second wiring structure 400, and may surround the at least one semiconductor chip 100. In some embodiments, the semiconductor package 1 may be a fan out type panel level package (FOPLP).

In some embodiments, at least one of the first wiring structure 200 or the second wiring structure 400 may be formed by a redistribution process. The first wiring structure 200 and the second wiring structure 400 may be referred to as a first redistribution structure and a second redistribution structure, or a lower redistribution structure and an upper redistribution structure, respectively. In some embodiments, the semiconductor package 1 may be formed in a chip-first manner in which the expanded layer 300 and the at least one semiconductor chip 100 may be formed, and the first wiring structure 200 and the second wiring structure 400 may be formed on the expanded layer 300 and the at least one semiconductor chip 100. In some other embodiments, at least one of the first wiring structure 200 or the second wiring structure 400 may be a printed circuit board similar to a package substrate 700 shown in FIG. 9.

The first wiring structure 200 may include a first redistribution insulation layer 210 and a plurality of first redistribution patterns 220. The first redistribution insulation layer 210 may surround the plurality of first redistribution patterns 220. In some embodiments, the first redistribution structure 200 may include a plurality of stacked first redistribution insulation layers 210. The first redistribution insulation layer 210 may include an organic material. For example, the first redistribution insulation layer 210 may be formed from photo-imageable dielectrics (PID) or photo-sensitive polyimide (PSPI), or may be formed from a build-up film such as AJINOMOTO BUILD-UP FILM® (ABF).

The plurality of first redistribution patterns 220 may include a plurality of first redistribution line patterns 222, a plurality of first redistribution vias 224, and a plurality of first redistribution seed layers 226. The plurality of first redistribution patterns 220 may be, for example, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru) or the like, or a metal alloy thereof, but is not limited thereto. In some embodiments, the first redistribution line patterns 222 and the first redistribution vias 224 may be made of the same material, and the first redistribution seed layers 226 may be made of a material different from each of the first redistribution line patterns 222 and the first redistribution vias 224. In some embodiments, the first redistribution line pattern 222 and the first redistribution via 224 may include copper. For example, the first redistribution line pattern 222 and the first redistribution via 224 may be formed of copper or a copper alloy. In some embodiments, the first redistribution seed layer 226 may include titanium. For example, the first redistribution seed layer 226 may be formed of titanium or titanium nitride.

The plurality of first redistribution vias 224 may be disposed on the plurality of first redistribution line pattern patterns 222, respectively. For example, a first redistribution via of the plurality of first redistribution vias 224 may be disposed in a first redistribution line insulation layer of the first redistribution insulation layers 210 and on a first redistribution line pattern of the redistribution line pattern patterns 222 disposed in a second redistribution line insulation layer of the first redistribution insulation layers 210. In some embodiments, the plurality of first redistribution vias 224 may have a tapered shape extending from a lower side with a wide horizontal width to an upper side with a narrow horizontal width. For example, the plurality of first redistribution vias 224 may have a wider horizontal width as being farther from at least one semiconductor chip 100.

In some embodiments, at least some of the plurality of first redistribution line patterns 222 may be formed together with some of the plurality of first redistribution vias 224 to be integrated with each other. For example, the first redistribution line patterns 222 and the first redistribution vias 224 in contact with the top surfaces of the first redistribution line patterns 222, that is, the first redistribution vias 224 extending from the top surfaces of the first redistribution line patterns 222 may be formed together to be integral with each other. For example, each of the plurality of first redistribution vias 224 may have a narrowing horizontal width while moving away from the integrated first redistribution line patterns 222. The first redistribution seed layer 226 may cover the first redistribution line pattern 222 and the first redistribution via 224. For example, the first redistribution seed layers 226 may cover top surfaces of the first redistribution line patterns 222 and side and top surfaces of the first redistribution vias 224 among the surfaces of the first redistribution line patterns 222 and the first redistribution vias 224 integrally formed with each other. The first redistribution seed layer 226 may not cover side surfaces and bottom surfaces of the first redistribution line pattern 222. For example, side surfaces and bottom surfaces of the first redistribution line pattern 222 may directly contact the first redistribution insulation layers 210.

In some embodiments, the top surface of an uppermost first redistribution insulation layer of the first redistribution insulation layers 210 and the uppermost surface of the plurality of first redistribution patterns 220, for example, the top surface of an uppermost first redistribution line pattern of the first redistribution line patterns 222 may be positioned at the same vertical level to be coplanar.

The first wiring structure 200 may include a plurality of bottom surface connection pads PAD-L arranged on the bottom surface of the first wiring structure 200. In some embodiments, each of the plurality of lower connection pads may include a bottom surface connection pad layer 230 covering a portion of the first redistribution line pattern 222. For example, the bottom surface connection pad layer 230 may cover a bottom surface of a portion of the first redistribution line pattern 222. The bottom surface connection pad layer 230 may include a first bottom surface metal layer 232 and a second bottom surface metal layer 234. The first bottom surface metal layer 232 and the second bottom surface metal layer 234 may be sequentially stacked on a bottom surface of a portion of the first redistribution line pattern 222. In some embodiments, the first bottom surface metal layer 232 may include nickel (Ni), and the second bottom surface metal layer 234 may include gold (Au), but embodiments are not limited thereto. A plurality of external connection terminals 500 may be attached to the plurality of bottom surface connection pads PAD-L. The plurality of external connection terminals 500 may connect the semiconductor package 1 to the outside of the semiconductor package 1.

At least one semiconductor chip 100 may be mounted on the first redistribution structure 200. The semiconductor chip 100 may include a semiconductor substrate 110 having an active surface and an inactive surface disposed opposite to each other, a semiconductor device 112 formed on the active surface of the semiconductor substrate 110, and a plurality of chip pads 120 arranged on the semiconductor device 112. The semiconductor chip 100 may have a first surface and a second surface disposed opposite to each other. The plurality of chip pads 120 may be arranged on the first surface of the semiconductor chip 100. The plurality of chip pads 120 may be arranged in the first surface of the semiconductor chip 100 and coplanar with the first surface of the semiconductor chip 100. The second surface of the semiconductor chip 100 may be the inactive surface of the semiconductor substrate 110. Since the active surface of the semiconductor substrate 110 is substantially the same as the first surface of the semiconductor chip 100, an illustration separating the active surface of the semiconductor substrate 110 from the first surface of the semiconductor chip 100 is omitted.

The semiconductor substrate 110 may include, for example, a semiconductor material such as silicon (Si) or germanium (Ge). Alternatively, the semiconductor substrate 110 may include a compound semiconductor material, such as silicon carbide (SiC), gallium arsenide (GaAs), indium arsenide (InAs), or indium phosphide (InP). The semiconductor substrate 110 may include a conductive region, for example, a well doped with impurities. The semiconductor substrate 110 may have various device isolation structures such as a shallow trench isolation (STI) structure.

The semiconductor device 112 may include a plurality of types of individual devices, which may be formed on the active surface of the semiconductor substrate 110. The plurality of individual devices may include various microelectronic devices, such as metal-oxide-semiconductor field effect transistors (MOSFET) such as complementary metal-insulator-semiconductor (CMOS) transistor, system large scale integration (LSI), active devices, passive devices, etc. The plurality of individual devices may be electrically connected to the conductive region of the semiconductor substrate 110. The semiconductor device 112 may further include a conductive wire or a conductive plug electrically connecting at least two of the plurality of individual devices, or the plurality of individual devices to the conductive region of the semiconductor substrate 110. In addition, each of the plurality of individual devices may be electrically separated from other neighboring individual devices by an insulation film.

In some embodiments, the semiconductor chip 100 may include a logic device. For example, the semiconductor chip 100 may be a central processing unit (CPU) chip, a graphic processing unit (GPU) chip, or an application processor (AP) chip. In some other embodiments, the semiconductor chip 100 may be a memory semiconductor chip including a memory device. For example, the memory device may be a nonvolatile memory device, such as flash memory, phase-change random access memory (PRAM), magnetoresistive random access memory (MRAM), ferroelectric random access memory (FeRAM), or resistive random access memory (RRAM). The flash memory may be, for example, a NAND flash memory or a V-NAND flash memory. In some embodiments, the memory device may be a volatile memory device, such as dynamic random access memory (DRAM) or static random access memory (SRAM). In some other embodiments, when the semiconductor package 1 includes the plurality of semiconductor chips 100, at least one of the plurality of semiconductor chips 100 may be a central processing unit chip, a graphic processing unit chip, or an application processor chip, and at least one of the plurality of semiconductor chips 100 may be a memory semiconductor chip including a memory device.

In some embodiments, the semiconductor chip 100 may have a face-down arrangement in which the first surface faces the first redistribution structure 200, and may be attached to the top surface of the first redistribution structure 200. For example, the semiconductor chip 100 may be disposed on the first wiring structure 200 so that the plurality of chip pads 120 may face the first wiring structure 200. In this case, the first surface of the semiconductor chip 100 may be referred to as the bottom surface of the semiconductor chip 100, and the second surface of the semiconductor chip 100 may be referred to as the top surface of the semiconductor chip 100.

The expanded layer 300 may define a mounting space 300G in which at least one semiconductor chip 100 is disposed. The expanded layer 300 may include an expanded base layer 310 and a plurality of via structures 320. The plurality of via structures 320 may penetrate from a top surface to a bottom surface of the expanded base layer 310. The expanded layer 300 may be a printed circuit board (PCB), a ceramic substrate, a package manufacturing wafer, or an interposer. The expanded layer 300 may include one expanded base layer 310, but is not limited thereto. In some embodiments, the expanded layer 300 may include two or more stacked expanded base layers 310. For example, the expanded layer 300 may be a multi-layer printed circuit board.

The mounting space 300G may be formed as an opening or a cavity in the expanded layer 300. The mounting space 300G may be formed in a portion of the expanded layer 300, for example, a central region in a plan view. The mounting space 300G may be formed to penetrate from a top surface to a bottom surface of the expanded layer 300.

The expanded base layer 310 may be formed of at least one of phenol resin, epoxy resin, or polyimide. For example, the expanded base layer 310 may include at least one of frame retardant 4 (FR4), tetrafunctional epoxy, polyphenylene ether, epoxy/polyphenylene oxide, bismaleimide triazine (BT), Thermount, Cyanate ester, polyimide or liquid crystal polymer. Each of the plurality of via structures 320 may include a via connection pattern portion 322 and an extended via portion 324. The via connection pattern portion 322 may be disposed on a top surface or a bottom surface of the expanded base layer 310. For example, when the expanded layer 300 includes more than one expanded base layer 310, the via connection pattern portion 322 may be arranged in at least one of the top surface of an uppermost expanded base layer of the expanded base layers 310, the bottom surface of a lowermost expanded base layer of the expanded base layers 310, or between two adjacent expanded base layers 310 among the expanded base layers 310. The extended via portion 324 may pass through the expanded base layer 310 and may extend in a vertical direction. The extended via portion 324 may connect between two via connection pattern portions 322 positioned at different vertical levels. In some embodiments, the via connection pattern portions 322 may include an electrolytically deposited (ED) copper foil, a rolled-annealed (RA) copper foil, stainless steel foil, aluminum foil, ultra-thin copper foils, sputtered copper, copper alloys, etc. In some embodiments, the extended via portion 324 may include copper (Cu) or an alloy including copper (Cu). For example, the extended via portions 324 may have a structure in which copper (Cu) or an alloy including copper (Cu) is stacked on a seed layer including copper (Cu), titanium (Ti), titanium tungsten (TiW), titanium nitride (TiN), tantalum (Ta), tantalum nitride (TaN), chromium (Cr), Cu+Ti in which copper is stacked on titanium, or Cu/TiW on which copper is stacked on titanium tungsten, but embodiments are not limited thereto. In FIG. 1A, the extended via portion 324 may be disposed in the via hole penetrating the expanded base layer 310. The extended via portion 324 may be fill the via hole penetrating the expanded base layer 310, but is not limited thereto. For example, the extended via portion 324 may cover an inner sidewall of the via hole, and may not fill an entire portion of the via hole. In a case where the extended via portion 324 covers an inner sidewall of the via hole, a hole filling insulation layer may be formed in the through-hole. The hole filling insulation layer may cover the extended via portion 324 in the via hole and may fill the entire portion of the via hole.

Among the plurality of via connection pattern portions 322 included in the plurality of via structures 320, each of the via connection pattern portions 322 positioned at the lowermost end may be referred to as a bottom surface expanded connection pad 322P2. In some embodiments, the bottom surface of the expanded base layer 310 and a lower surface of the bottom surface expanded connection pad 322P2 may be positioned at the same vertical level to be coplanar. For example, when a plurality of the stacked expanded base layers 310 are included in the expanded layer 300, the bottom surface of the lowermost expanded base layer 310 among the plurality of the expanded base layers 310 and the lowermost surface of the plurality of via structures 320 may be positioned at the same vertical level to be coplanar. For example, the bottom surface of the lowermost expanded base layer 310, the lowermost surface of the plurality of via structures 320, the top surface of the uppermost first redistribution insulation layer 210, and the top surface of the uppermost first redistribution pattern 220 may be located at the same vertical level.

Among the plurality of via connection pattern portions 322 included in the plurality of via structures 320, 322P2each of the via connection pattern portions 322 positioned at the uppermost end may be referred to as a top surface expanded connection pad 322P1. In some embodiments, the bottom surface of the lowermost expanded base layer 310 and the bottom surface of the plurality of bottom surface expanded connection pads 322P2 may be positioned at the same vertical level to be coplanar. For example, the bottom surface of the lowermost expanded base layer 310, the bottom surface of the plurality of bottom surface expanded connection pads 322P2, the top surface of the uppermost first redistribution insulation layer 210, and the top surface of the uppermost first redistribution pattern 220 may be located at the same vertical level. For example, a plurality of bottom surface expanded connection pads 322P2 may be embedded in the expanded base layer 310. In some embodiments, the plurality of top surface expanded connection pads 322P1 may not be embedded in the expanded base layer 310 and may protrude upward from the top surface of the expanded base layer 310, but are not limited thereto. For example, the plurality of top expanded connection pads 322P1 may be embedded in the expanded base layer 310, and the top surface of the top expanded base layer 310 and the top surfaces of the plurality of top expanded connection pads 322P1 may be located at the same vertical level.

The semiconductor package 1 may further include a filling insulation layer 390 disposed in the mounting space 300G. The filling insulation layer 390 may fill the mounting space 300G. The filling insulation layer 390 may fill a space between the at least one semiconductor chip 100 arranged in the mounting space 300G and the expanded base layer 310. The filling insulation layer 390 may be formed of a thermosetting resin such as an epoxy resin, a thermoplastic resin such as polyimide, or a resin including a reinforcement such as an inorganic filler in addition to the thermosetting resin or the thermoplastic resin, for example, ABF, FR-4, BT, etc. Alternatively, the filling insulation layer 390 may be formed from a molding material such as an EMC or a photosensitive material such as a photoimagable encapsulant (PIE). In some embodiments, a portion of the filling insulation layer 390 may be made of an insulation material such as a silicon oxide film, a silicon nitride film, or a silicon oxynitride film.

In some embodiments, the bottom surface of at least one semiconductor chip 100, the bottom surface of the expanded base layer 310, and the bottom surface of the filling insulation layer 390 may be positioned at the same vertical level to be coplanar. For example, the top surface of the uppermost first redistribution insulation layer 210, the top surface of the uppermost first redistribution pattern 220, the bottom surface of the chip pad 120, the lowermost surface of the plurality of via structures 320, the bottom surface of the expanded base layer 310, and the bottom surface of the filling insulation layer 390 may be located at the same vertical level. In some embodiments, the top surface of the expanded base layer 310 and the top surface of the filling insulation layer 390 may be positioned at the same vertical level to be coplanar.

The second wiring structure 400 may include a second redistribution insulation layer 410 and a plurality of second redistribution patterns 420. The plurality of second redistribution patterns 420 may include a plurality of second redistribution line patterns 422, a plurality of second redistribution vias 424, and a plurality of second redistribution seed layers 426. The plurality of second redistribution seed layers 426 may be disposed on lower surfaces of the plurality of second redistribution line patterns 422 and the plurality of second redistribution vias 424. The second redistribution insulation layer 410 and the plurality of second redistribution patterns 420 included in the second wiring structure 400 may be substantially similar to the first redistribution insulation layer 210 and the plurality of first redistribution patterns 220 included in the first wiring structure 200, and thus, redundant descriptions may be omitted.

In some embodiments, the thickness of the second wiring structure 400 may be less than that of the first wiring structure 200. For example, the first wiring structure 200 may have a thickness of about 30 micrometers (μm) to about 50 μm, and the second wiring structure 400 may have a thickness of about 20 μm to about 40 μm while being thinner than the first wiring structure 200. In some embodiments, the second wiring structure 400 may include a plurality of stacked second redistribution insulation layers 410. For example, the number of stacked second redistribution insulation layers 410 included in the second wiring structure 400 may be less than the number of stacked first redistribution insulation layers 210 included in the first wiring structure 200.

In some embodiments, the top surface of the expanded base layer 310, the top surface of the filling insulation layer 390, and the bottom surface of the second redistribution insulation layer 410 may be located at the same vertical level.

The plurality of second redistribution vias 424 may be connected to the plurality of second redistribution line pattern patterns 422, respectively, through at least one of the first redistribution insulation layers 410. In some embodiments, the plurality of second redistribution vias 424 may have a tapered shape extending from the lower side to the upper side with a widening horizontal width. For example, the plurality of second redistribution vias 424 may have a wide horizontal width farther from at least one semiconductor chip 100. Lowermost second redistribution vias among the plurality of second redistribution vias 424 may be connected to the top surface of the via structure 320.

In some embodiments, at least some of the plurality of second redistribution line patterns 422 may be formed together with some of the plurality of second redistribution vias 424 to form an integral body. For example, the second redistribution line pattern 422 and the second redistribution via 424 in contact with the bottom surface of the second redistribution line pattern 422, that is, the second redistribution via 424 extending from the bottom surface of the second redistribution line pattern 422 may be formed together to be integral with each other. For example, each of the plurality of second redistribution vias 424 may have a narrowing horizontal width while moving away from the second redistribution line pattern 422 respectively integrated therewith.

The second wiring structure 400 may include a plurality of top surface connection pads PAD-U. The plurality of top surface connection pads PAD-U may be disposed on the top surface of the second wiring structure 400. In some embodiments, each of the plurality of top surface connection pads PAD-U may include a top surface connection pad layer 430 covering portions of the top surfaces of the second redistribution line pattern 422. The top surface connection pad layer 430 may include a first top surface metal layer 432 and a second top surface metal layer 434 sequentially stacked on the second redistribution line pattern 422. In some embodiments, the first top surface metal layer 432 may include nickel (Ni), and the second top surface metal layer 434 may include gold (Au), but embodiments are not limited thereto.

The semiconductor package 1 may include a buried capacitor structure 350. The buried capacitor structure 350 may be buried in the expanded base layer 310. The buried capacitor structure 350 may include a plurality of electrode layers 360 spaced apart from each other. As illustrated in FIG. 1A and FIG. 1B, the plurality of electrode layers 360 may include a pair of adjacent electrode layers 360 disposed in a pair of first through-holes 360H, respectively, however embodiments are not limited thereto. In some embodiments, electrode layers 360 may cover inner sidewalls of first through-holes 360H penetrating the expanded base layer 310. For example, the electrode layers 360 may conformally cover the inner sidewalls of the first through-holes 360H and may not fill all of the first through-holes 360H. The electrode layers 360 may include copper. For example, the electrode layers 360 may be formed of copper or a copper alloy. Each of the first through-holes 360H may be filled by a hole plugging material layer 370. The hole plugging material layer 370 may cover the electrode layers 360 and may fill the first through-holes 360H. The hole plugging material layer 370 may be made of an insulation material. For example, the hole plugging material layer 370 may include solder resist ink or epoxy resin.

The buried capacitor structure 350 may further include a plurality of dielectric layers 380 disposed between the electrode layers 360. The plurality of dielectric layers 380 may be disposed in a plurality of second through-holes 380H, which may be spaced apart from each other between adjacent ones of the first through-holes 360H. The plurality of second through-holes 380H may be spaced apart from the first through-holes 360H. In some embodiments, the plurality of dielectric layers 380 may fill all of the plurality of second through-holes 380H. The dielectric layer 380 may include silicon oxide or a material having a dielectric constant higher than that of silicon oxide, or a material having a higher dielectric constant than a material of the expanded base layer 310, for example, a high-k dielectric material. For example, the dielectric layer 380 may include at least one of tantalum oxide (TaO), titanium oxide (TiO), barium strontium titanium oxide (BaSrTiO), barium titanium oxide (BaTiO), lead zirconate titanate (PZT), tantalic acid strontium bismuth (STB), bismuth iron oxide (BFO), strontium titanium oxide (SrTiO), yttrium oxide (YO), aluminum oxide (AlO), hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitide (ZrON), zirconium silicon oxynitide (ZrSiON), or lead scandium tantalum oxide (PbScTaO).

The buried capacitor structure 350 may extend from a top surface portion of the uppermost expanded base layer 310 to a bottom surface portion of the lowermost expanded base layer 310. For example, each of the electrode layer 360, the hole plugging material layer 370, and the dielectric layer 380 may extend from the top surface portion to the bottom surface portion of the expanded base layer 310.

In some embodiments, the uppermost end portion of the buried capacitor structure 350 and the top surface portion of the uppermost expanded base layer 310 may be located at the same vertical level to be coplanar. The lowermost end portion of the buried capacitor structure 350 and the bottom surface portion of the lowermost expanded base layer 310 may be located at the same vertical level to be coplanar. For example, top surfaces of the electrode layer 360, the hole plugging material layer 370, and the dielectric layer 380 may be coplanar by being positioned at the same vertical level as the top surface of the uppermost expanded base layer 310, and bottom surfaces of the electrode layer 360, the hole plugging material layer 370, and the dielectric layer 380 may be coplanar by being positioned at the same vertical level as the bottom surface of the lowermost expanded base layer 310.

In some other embodiments, at least one of the electrode layer 360, the hole plugging material layer 370, or the dielectric layer 380 may protrude from at least one of the upper surface or the bottom surface of the uppermost expanded base layer 310. For example, the electrode layer 360 may extend from the inner sidewall of the first through-hole 360H to a portion of at least one of the top surface or the bottom surface of the uppermost expanded base layer 310. For example, the hole plugging material layer 370 may protrude outward from the inside of the first through-hole 360H. For example, the dielectric layer 380 may protrude outward from the inside of the second through-hole 380H.

Each of the electrode layer 360, the hole plugging material layer 370, and the dielectric layer 380 may extend in both the vertical direction (Z direction) and the horizontal direction. The horizontal direction in which each of the electrode layer 360, the hole plugging material layer 370, and the dielectric layer 380 extends may be a horizontal direction in which the side surface of the semiconductor chip 100 adjacent to the buried capacitor structure 350 extends. Although FIG. 1A and FIG. 1B show that each of the electrode layer 360, the hole plugging material layer 370, and the dielectric layer 380 extends in a second horizontal direction (Y direction) perpendicular to the first horizontal direction (X direction), embodiments are not limited thereto, and each of the electrode layer 360, the hole-plugging material layer 370, and the dielectric layer 380 may extend in the first horizontal direction (X direction). In FIG. 1A and FIG. 1B, a case where each of the electrode layer 360, the hole plugging material layer 370, and the dielectric layer 380 extends in each of the vertical direction (Z direction) and the second horizontal direction (Y direction) will be described as an example.

Referring to FIG. 1B, the pair of electrode layers 360 may include a first electrode layer 360A adjacent to the semiconductor chip 100 (see FIG. 1A) and a second electrode layer 360B arranged farther from the semiconductor chip 100 than the first electrode layer 360A. For example, when the side surface of the semiconductor chip 100 adjacent to the buried capacitor structure 350 extends in the second horizontal direction (Y direction), the first electrode layer 360A, the plurality of dielectric layers 380, and the second electrode layer 360B may be sequentially spaced apart from the semiconductor chip 100 while moving away from the semiconductor chip 100 in the first horizontal direction (X direction).

Each of the first through-holes 360H and the second through-holes 380H may have a cross-sectional shape of an oval, a rectangle with rounded corners, or a rectangle in a plan view, and the planar shape of the electrode layers 360, the hole plugging material layers 370, and the dielectric layers 380 may correspond to the planar shapes of the first through-holes 360H and the second through-holes 380H. Each of the first through-holes 360H and the second through-holes 380H may extend in the extension direction of the side surface of the semiconductor chip 100 adjacent thereto in a plan view.

The buried capacitor structure 350 including the electrode layer 360, the hole plugging material layer 370, and the dielectric layer 380 may have a capacitor thickness TC in the vertical direction (Z direction) and a capacitor length LC in the second horizontal direction (Y direction). In the first horizontal direction (X direction), adjacent electrode layers 360 may be spaced apart from each other, with a capacitor interval DC therebetween. The capacitor thickness TC may be about 50 μm to about 200 μm, the capacitor length LC may be hundreds of μm, and a capacitor interval DC may be about 200 μm to about 700 μm. The buried capacitor structure 350 may have a capacitance of $\varepsilon \times (LC \times TC)/DC$. ε may be a dielectric constant of a portion of the expanded base layer 310 and the plurality of dielectric layers 380 arranged between the adjacent electrode layers 360. Therefore, the buried capacitor structure 350 may be implemented as a high-capacity capacitor by adjusting the capacitor interval DC and the number of the plurality of dielectric layers 380 arranged between the adjacent electrode layers 360. The electrode layer 360 may have an electrode layer thickness tp in a horizontal direction from an inner sidewall of the first through-hole 360H. That is, the thickness of the electrode layer 360 on the inner sidewall of the first through-hole 360H may be the electrode layer thickness tp. The electrode layer thickness tp may be about 5 μm to about 15 μm. The width of the first through-hole 360H in the short-axis direction may be about 30 μm to about 100 μm.

In some embodiments, the capacitor length LC may be a length of each of the first through-hole 360H and the second through-hole 380H extending in the second horizontal direction (Y direction). For example, the lengths of the first through-hole 360H and the second through-hole 380H extending in the second horizontal direction (Y direction) may both be the same as the capacitor length LC. In some other embodiments, the length of the first through-hole 360H extending in the second horizontal direction (Y direction) may be the capacitor length LC, and the length of the second through-hole 380H extending in the second horizontal direction (Y direction) may have a value smaller than the capacitor length LC. For example, the length of the second through-hole 380H extending in the second horizontal direction (Y direction) may be smaller than the capacitor length LC, and may be equal to or greater than a difference LC-tp between the capacitor length LC and the electrode layer thickness tp.

The semiconductor package 1 may further include capacitor connection structures 350C. Each capacitor connection structure 350C may be connected to a respective one of the electrode layers 360. In some embodiments, the capacitor connection structure 350C may include a capacitor connection pattern portion 322C and a capacitor connection via 224C. The capacitor connection pattern portion 322C may be a portion of a via structures of the plurality of via structures 320, and the capacitor connection via 224C may be a portion of a first redistribution pattern of the plurality of first redistribution patterns 220. For example, the capacitor connection pattern portions 322C may be some of the plurality of via connection pattern portions 322, and the capacitor connection vias 224C may be some of the plurality of first redistribution vias 224. In some other embodiments, the capacitor connection structure 350C may include the capacitor connection pattern portion 322C, and may not include the capacitor connection via 224C.

In some embodiments, the buried capacitor structure 350 may be electrically connected to the semiconductor chip 100 through the capacitor connection structures 350C. For example, each of the electrode layers 360 of the buried capacitor structure 350 may be electrically connected to the semiconductor chip 100 through the capacitor connection pattern portion 322C and the capacitor connection via 224C. In some embodiments, each of the electrode layers 360 of the buried capacitor structure 350 may be electrically connected to the semiconductor chip 100 through the capacitor connection pattern portion 322C, and the capacitor connection via 224C, together with the first redistribution via 224 other than the capacitor connection via 224C and the first redistribution line pattern 222. In some embodiments, each of the electrode layers 360 of the buried capacitor structure 350 may be electrically connected to the semiconductor chip 100 through the capacitor connection pattern portion 322C.

In some embodiments, the buried capacitor structure 350 may be electrically connected to components including the plurality of via structures 320 included in the expanded layer 300 through the capacitor connection structures 350C. For example, the buried capacitor structure 350 may be connected to at least one of the via connection pattern portion 322, the extended via portion 324, the bottom surface expanded connection pad 322P2, or the top surface expanded connection pad 322P1 through some of the capacitor connection pattern portions 322C of the plurality of via connection pattern portion 322. Alternatively, for example, the buried capacitor structure 350 may be electrically connected to a conductive plate or a conductive dummy pattern such as a grid pattern, which may be included in the expanded layer 300. Alternatively, in some embodiments, the semiconductor package 1 may include a plurality of buried capacitor structures 350. At least one buried capacitor structure 350 among the plurality of buried capacitor structures 350 may be electrically connected to the semiconductor chip 100. At least one other buried capacitor structure 350 may be electrically connected to components including the plurality of via structures 320 included in the expanded layer 300. The semiconductor package 1 according to the inventive concepts may include the buried capacitor structure 350 buried in the expanded base layer 310 of the expanded layer 300, and there may be no need to attach a separate Land-Side Capacitor (LSC) on the bottom surface of the first wiring structure 200. Thus, the area of the semiconductor package 1 may be reduced, and the plurality of external connection terminals 500 may be freely arranged. In addition, since the buried capacitor structure 350 may be disposed adjacent to the semiconductor chip 100 and the buried capacitor structure 350 may be implemented as a high-capacity capacitor, the operation reliability of the semiconductor package 1 may be improved by reducing rippling that may occur during the operation of the semiconductor package 1.

In addition, since the semiconductor package 1 according to embodiments does not need to attach a separate LSC, manufacturing costs may be reduced and Turn Around Time (TAT) may be shortened.

Figure 2A:
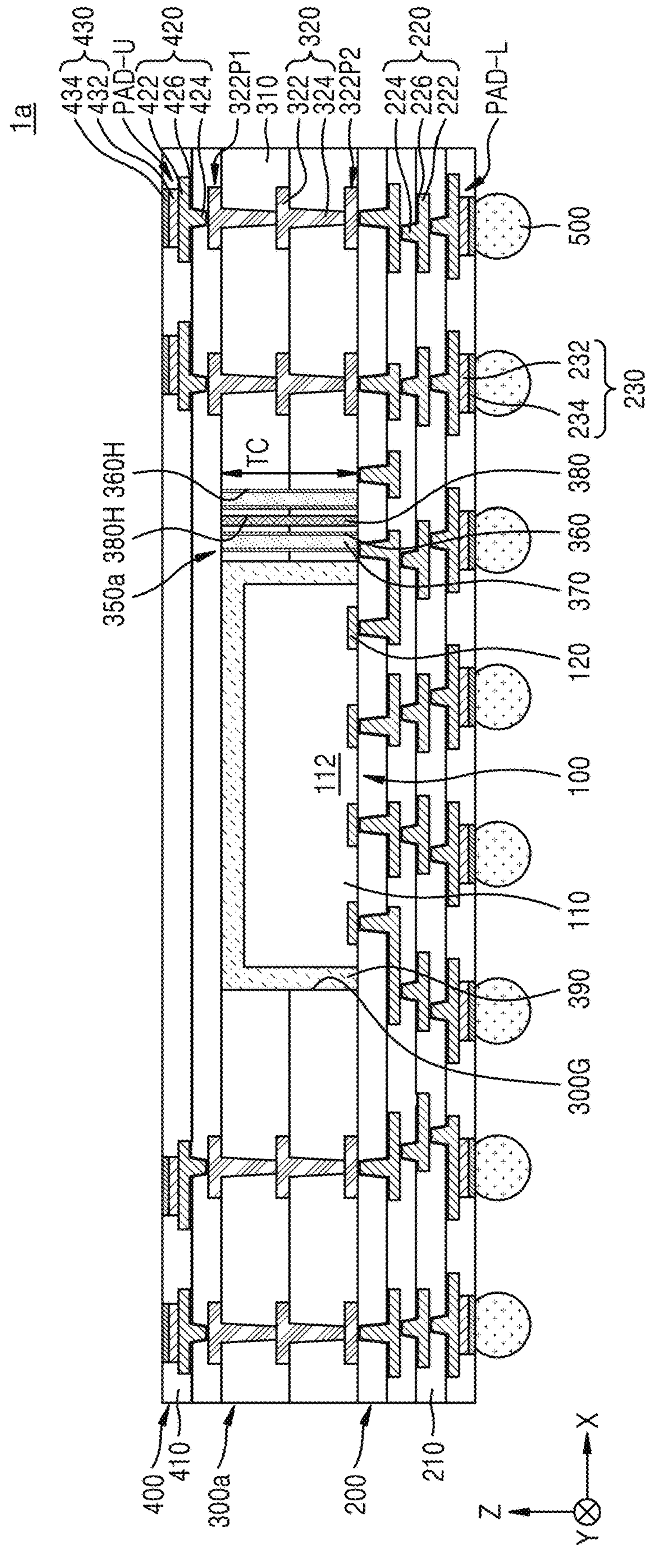
FIG. 2A is a cross-sectional view of a semiconductor package that is a fan-out panel level package, according to embodiments.
Figure 2B:
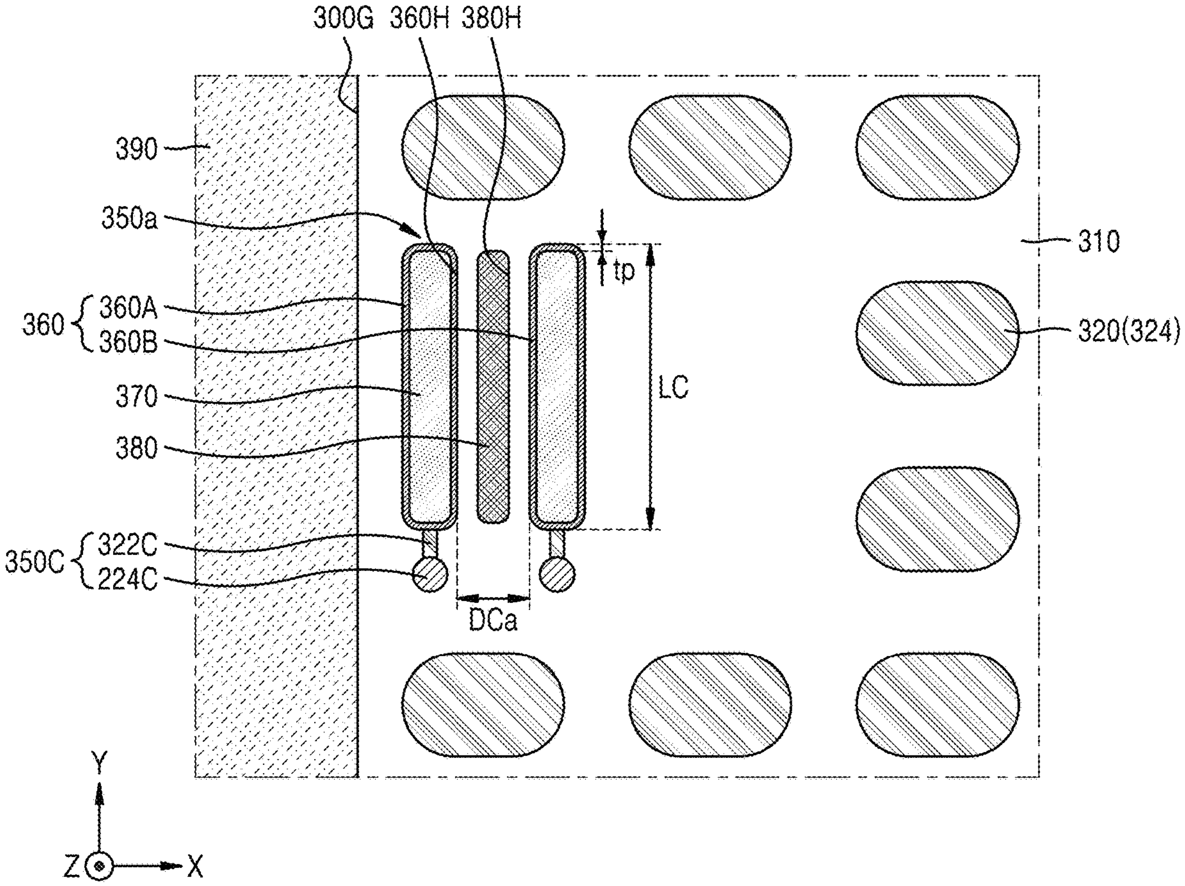
FIG. 2B is an enlarged plan view showing part of the semiconductor package.

FIG. 2A is a cross-sectional view of a semiconductor package that is a fan-out panel level package according to embodiments, and FIG. 2B is an enlarged plan view showing a part of the semiconductor package. In FIG. 2A and FIG. 2B, redundant descriptions with reference to FIG. 1A and FIG. 1B may be omitted.

Referring to FIG. 2A and FIG. 2B together, the semiconductor package 1*a* may include a first wiring structure 200, a second wiring structure 400 on the first wiring structure 200, at least one semiconductor chip 100 arranged between the first wiring structure 200 and the second wiring structure 400, and an expanded layer 300*a* arranged between the first wiring structure 200 and the second wiring structure 400 and surrounding the at least one semiconductor chip 100. The expanded layer 300*a* may electrically connect the first wiring structure 200 and the second wiring structure 400 with each other. The expanded layer 300*a* may have a mounting space 300G in which at least one semiconductor chip 100 is arranged. The expanded layer 300*a* may include an expanded base layer 310 and a plurality of via structures 320.

The semiconductor package 1*a* may include a buried capacitor structure 350*a*. The buried capacitor structure 350*a* may be buried in the expanded base layer 310. The buried capacitor structure 350*a* may include a plurality of electrode layers 360 spaced apart from each other and a dielectric layer 380 disposed between adjacent ones of the electrode layers 360. In some embodiments, a pair of electrode layers 360 may cover inner sidewalls of a pair of first through-holes 360H penetrating the expanded base layer 310. The hole plugging material layer 370 may cover the electrode layers 360 and may fill the first through-holes 360H. The dielectric layer 380 may fill all of the second through-holes 380H spaced apart from the first through-holes 360H and disposed between the first through-holes 360H.

The uppermost end of the buried capacitor structure 350*a* and the top surface portion of the uppermost expanded base layer 310 may be located at the same vertical level to be coplanar. The lowermost end of the buried capacitor structure 350*a* and the bottom surface portion of the lowermost expanded base layer 310 may be located at the same vertical level to be coplanar. For example, top surfaces of the electrode layer 360, the hole plugging material layer 370, and the dielectric layer 380 may be coplanar by being positioned at the same vertical level as the top surface portion of the uppermost expanded base layer 310, and bottom surfaces of the electrode layer 360, the hole plugging material layer 370, and the dielectric layer 380 may be coplanar by being positioned at the same vertical level as the bottom surface portion of the lowermost expanded base layer 310.

The buried capacitor structure 350*a* including the electrode layer 360, the hole plugging material layer 370, and the dielectric layer 380 may have a capacitor thickness TC in the vertical direction (Z direction) and a capacitor length LC in the second horizontal direction (Y direction). In the first horizontal direction (X direction), the electrode layers 360 may be spaced apart from each other, with a capacitor interval DCa therebetween. The capacitor thickness TC may be about 50 μm to about 200 μm, the capacitor length LC may be hundreds of μm, and a capacitor interval DCa may be about 100 μm to about 300 μm. The buried capacitor structure 350*a* may have a capacitance of $\varepsilon \times (LC \times TC)/DCa$. The electrode layer 360 may have an electrode layer thickness tp in a horizontal direction from an inner sidewall of the first through-hole 360H. The electrode layer thickness tp may be about 5 μm to about 15 μm.

In some embodiments, the buried capacitor structure 350*a* may be electrically connected to the semiconductor chip 100 through the capacitor connection structures 350C. In some embodiments, the buried capacitor structure 350*a* may be electrically connected to components including the plurality of via structures 320 included in the expanded layer 300*a* through the capacitor connection structures 350C.

Figure 3A:
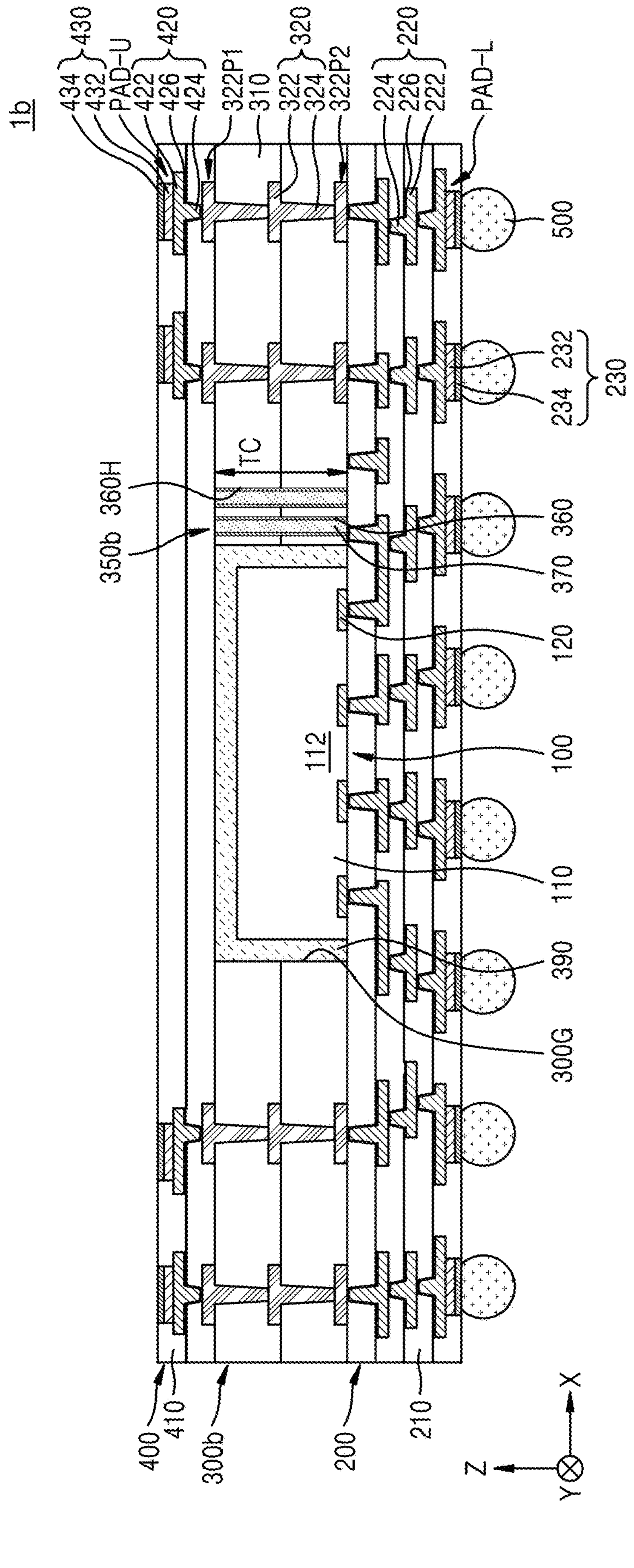
FIG. 3A is a cross-sectional view of a semiconductor package that is a fan-out panel level package, according to embodiments.
Figure 3B:
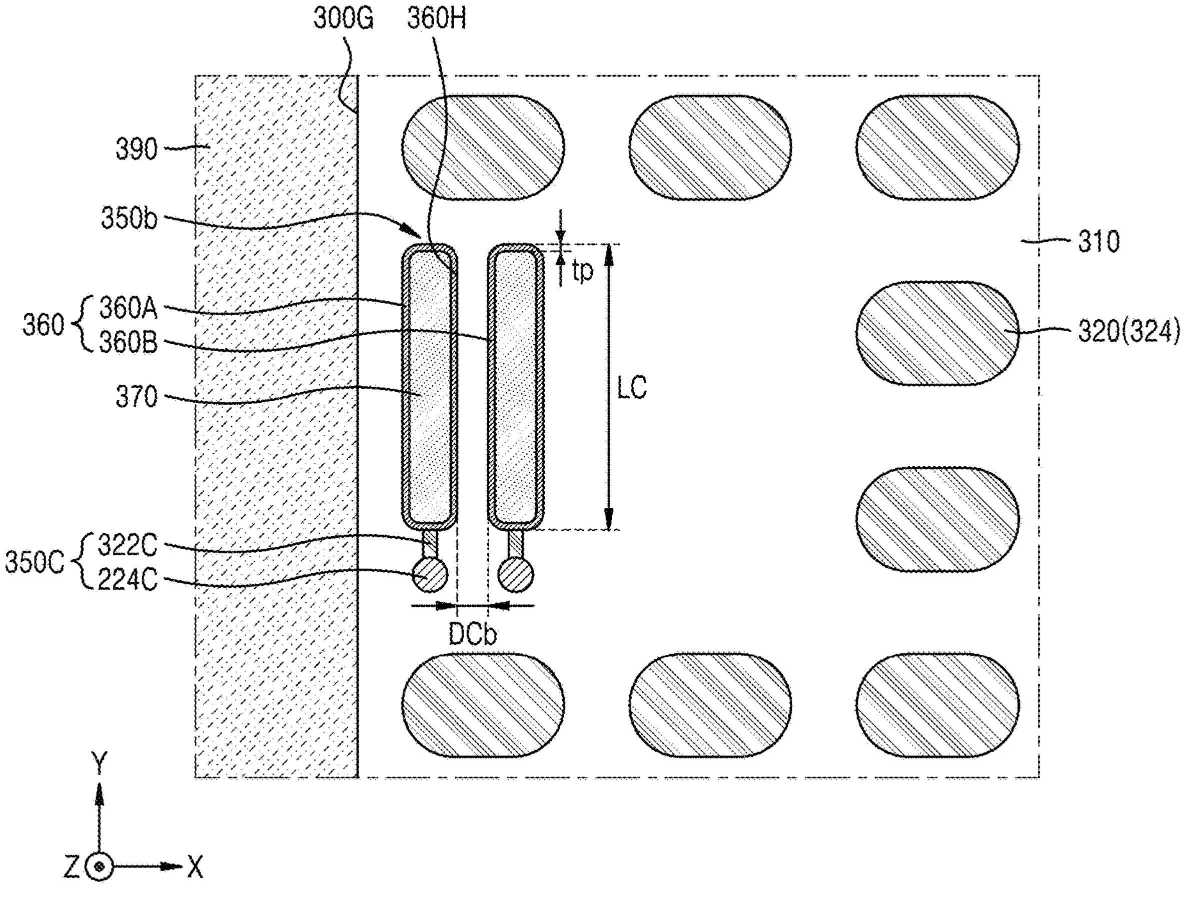
FIG. 3B is an enlarged plan view showing part of the semiconductor package of FIG. 3A.

FIG. 3A is a cross-sectional view of a semiconductor package that is a fan-out panel level package according to embodiments, and FIG. 3B is an enlarged plan view showing a part of the semiconductor package; In FIG. 3A and FIG. 3B, redundant descriptions with reference to FIGS. 1A to 2B may be omitted.

Referring to FIG. 3A and FIG. 3B together, the semiconductor package 1*b* may include a first wiring structure 200, a second wiring structure 400 on the first wiring structure 200, at least one semiconductor chip 100 arranged between the first wiring structure 200 and the second wiring structure 400, and an expanded layer 300*b* arranged between the first wiring structure 200 and the second wiring structure 400 and surrounding the at least one semiconductor chip 100. The expanded layer 300*b* may electrically connect the first wiring structure 200 and the second wiring structure 400 with each other. The expanded layer 300*b* may have a mounting space 300G in which at least one semiconductor chip 100 is arranged. The expanded layer 300*b* may include an expanded base layer 310 and a plurality of via structures 320.

The semiconductor package 1*b* may include a buried capacitor structure 350*b*. The buried capacitor structure 350*b* may be buried in the expanded base layer 310. The buried capacitor structure 350*b* may include a plurality of electrode layers 360 spaced apart from each other. For example, the buried capacitor structure 350*b* may include a pair of electrode layers 360 spaced apart from each other. In some embodiments, the electrode layers 360 may cover inner sidewalls of the first through-holes 360H penetrating the expanded base layer 310. The hole plugging material layer 370 may cover the electrode layers 360 and may fill the first through-holes 360H. The buried capacitor structure 350*b* may not include the dielectric layer 380 shown in FIGS. 1A to 2B.

The uppermost end of the buried capacitor structure 350*b* and the top surface of the uppermost expanded base layer 310 may be located at the same vertical level to be coplanar. The lowermost end of the buried capacitor structure 350*b* and the bottom surface of the lowermost expanded base layer 310 may be located at the same vertical level to be coplanar. For example, top surfaces of the electrode layer 360 and the hole plugging material layer 370 may be coplanar by being positioned at the same vertical level as the top surface of the uppermost expanded base layer 310, and bottom surfaces of the electrode layer 360 and the hole plugging material layer 370 may be coplanar by being positioned at the same vertical level as the bottom surface of the lowermost expanded base layer 310.

The buried capacitor structure 350*a* including the electrode layer 360 and the hole plugging material layer 370 may have a capacitor thickness TC in the vertical direction (Z direction) and a capacitor length LC in the second horizontal direction (Y direction). In the first horizontal direction (X direction), the plurality of electrode layers 360 may be spaced apart from each other, with a capacitor interval DCb therebetween. For example, a pair of adjacent electrode layers 360 may be spaced apart from each other, with a capacitor interval DCb therebetween. The capacitor thickness TC may be about 50 μm to about 200 μm, the capacitor length LC may be hundreds of μm, and a capacitor interval DCb may be about 30 μm to about 100 μm. The buried capacitor structure 350*b* may have a capacitance of $\varepsilon \times (LC \times TC)/DCb$. ε may be a dielectric constant of a portion of the expanded base layer 310 arranged between the electrode layers 360. The electrode layer 360 may have an electrode layer thickness tp in a horizontal direction from an inner sidewall of the first through-hole 360H. The electrode layer thickness tp may be about 5 μm to about 15 μm.

In some embodiments, the buried capacitor structure 350*b* may be electrically connected to the semiconductor chip 100 through the capacitor connection structures 350C. In some embodiments, the buried capacitor structure 350*b* may be electrically connected to components including the plurality of via structures 320 included in the expanded layer 300*b* through the capacitor connection structures 350C.

FIGS. 4A to 4K are cross-sectional views illustrating a method of manufacturing a semiconductor package that is a fan-out panel level package according to embodiments; FIGS. 4A to 4K are cross-sectional views illustrating a method of manufacturing the semiconductor package 1 shown in FIG. 1A and FIG. 1B, and redundant descriptions with reference to FIG. 1A and FIG. 1B may be omitted.

Figure 4A:
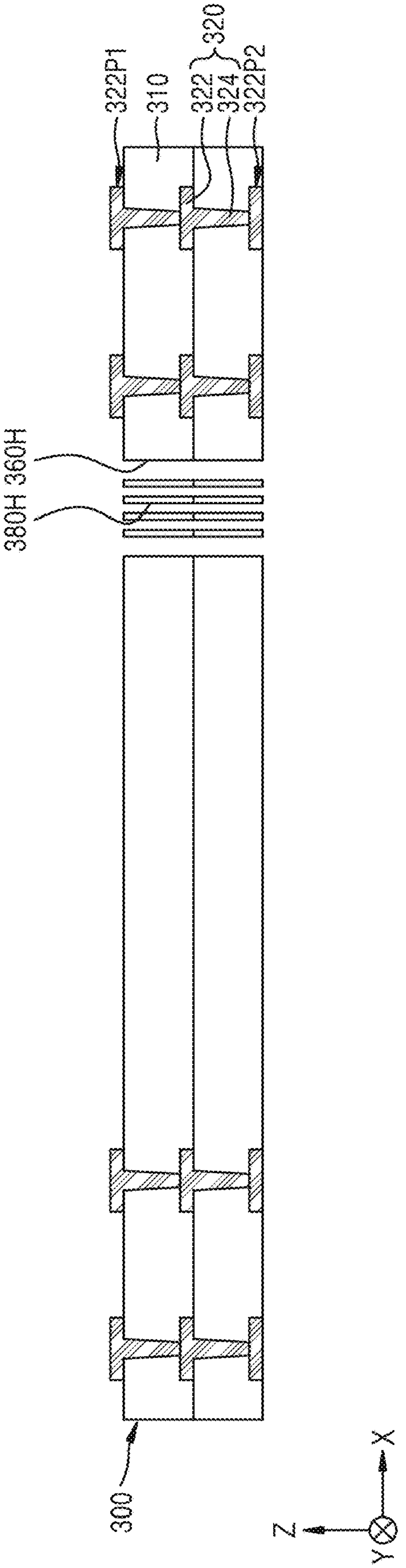
FIGS. 4A, 4B, 4C, 4D, 4E, 4F, 4G, 4H, 4I, 4J, and 4K are cross-sectional views illustrating a method of manufacturing a semiconductor package that is a fan-out panel level package, according to embodiments.

Referring to FIG. 4A, an expanded layer 300 including an expanded base layer 310 and a plurality of via structures 320 may be prepared, and a plurality of first through-holes 360H and a plurality of second through-holes 380H penetrating the expanded base layer 310 may be formed. As described herein the plurality of via structures 320 may further include the top surface expanded connection pads 322P1 and the bottom surface expanded connection pads 322P2. The first through-holes 360H and the second through-holes 380H may be formed by using a drill bit or a laser drilling process. The first through-holes 360H and a plurality of second through-holes 380H may be formed to be spaced apart from one another. The plurality of second through-holes 380H may be formed between the first through-holes 360H.

Figure 4B:
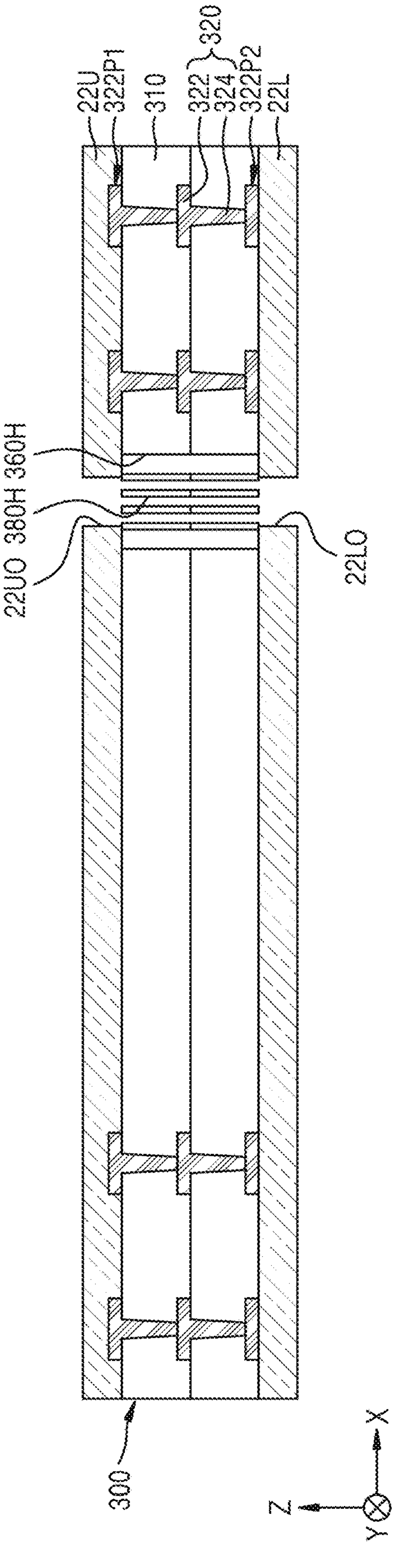

Referring to FIG. 4B, a first top surface cover layer 22U and a first bottom surface cover layer 22L covering the top and bottom surfaces of the expanded layer 300 may be formed. The first top surface cover layer 22U and the first bottom surface cover layer 22L may have respective thicknesses sufficient to cover the top surface expanded connection pads 322P1 and the bottom surface expanded connection pads 322P2. For example, a thickness of the first top surface cover layer 22U may be greater than a height of the top surface expanded connection pads 322P1. Each of the first top surface cover layer 22U and the first bottom surface cover layer 22L may be an adhesive film, but are not limited thereto. For example, the first top surface cover layer 22U and the first bottom surface cover layer 22L may include a dicing film. The first top surface cover layer 22U and the first bottom surface cover layer 22L may respectively have a first top surface opening 22UO and a first bottom surface opening 22LO. The first top surface opening 22UO and the first bottom surface opening 22LO may be disposed to correspond to each other in the vertical direction (Z direction). For example, the first top surface opening 22UO may be formed on the first bottom surface opening 22LO. The first top surface opening 22UO and the first bottom surface opening 22LO may correspond to the plurality of second through-holes 380H. For example, the first top surface cover layer 22U having the first top surface opening 22UO and the first bottom surface cover layer 22L having the first bottom surface opening 22LO may cover the top surface and the bottom surfaces of the expanded layer 300 and may cover the first through-holes 360H, and may expose the plurality of second through-holes 380H without covering the plurality of second through-holes 380H.

Figure 4C:
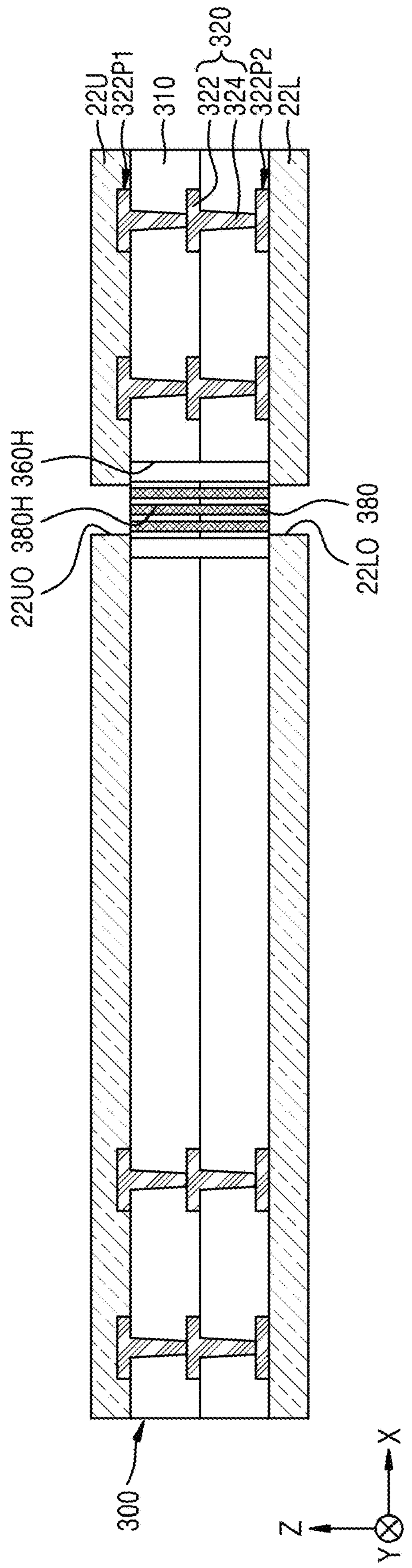

Referring to FIG. 4C, the plurality of dielectric layers 380 may be formed in the plurality of second through-holes 380H exposed by the first top surface opening 22UO and the first bottom surface opening 22LO. In some embodiments, the plurality of dielectric layers 380 may be formed by injecting a liquid type material into the plurality of second through-holes 380H and curing the liquid type material.

After the plurality of dielectric layers 380 are formed, the first top surface cover layer 22U and the first bottom surface cover layer 22L may be removed.

Figure 4D:
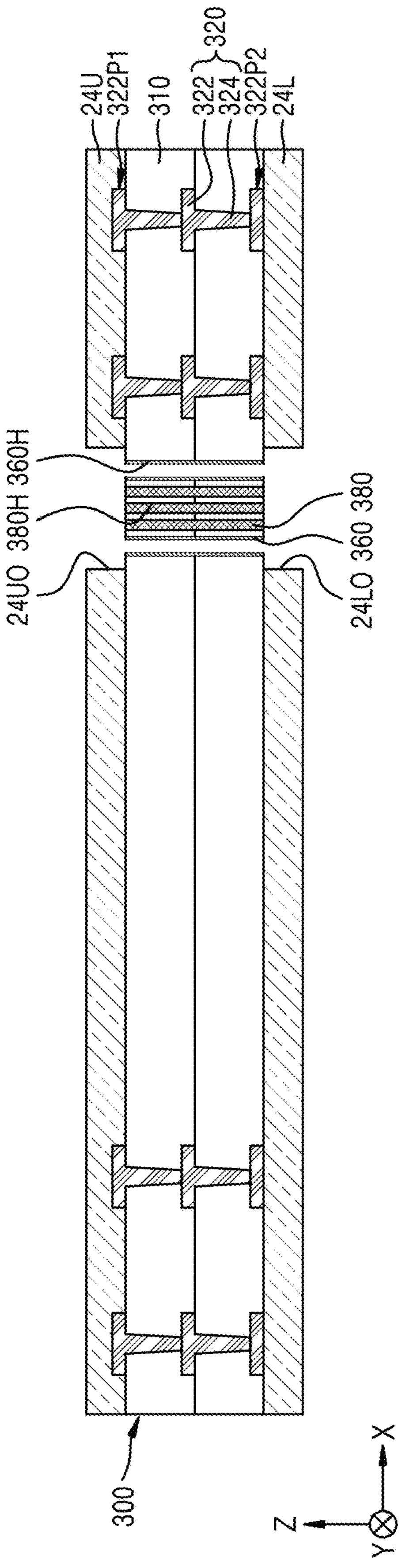

Referring to FIG. 4D, a second top surface cover layer 24U and a second bottom surface cover layer 24L covering the top and bottom surfaces of the expanded layer 300 may be formed. Each of the second top surface cover layer 24U and the second bottom surface cover layer 24L may include an adhesive film. For example, the second top surface cover layer 24U and the second bottom surface cover layer 24L may include dicing films, but are not limited thereto. The second top surface cover layer 24U and the second bottom surface cover layer 24L may respectively have a second top surface opening 24UO and a second bottom surface opening 24LO corresponding to each other. The second top surface opening 24UO and the second bottom surface opening 24LO may correspond to the first through-holes 360H. For example, the second top surface cover layer 24U having the second top surface opening 24UO and the second bottom surface cover layer 24L having the second bottom surface opening 24LO may cover the top and bottom surfaces of the expanded layer 300 and may expose the first through-holes 360H without covering the first through-holes 360H. In some embodiments, the second top surface opening 24UO and the second bottom surface opening 24LO correspond to a pair of first through-holes 360H and the plurality of second through-holes 380H, and the second top surface cover layer 24U having the second top surface opening 24UO and the second bottom surface cover layer 24L having the second bottom surface opening 24LO may cover the top surface and bottom surface of the expanded layer 300 and may expose the first through-holes 360H and the plurality of second through-holes 380H without covering the first through-holes 360H and the plurality of second through-holes 380H. For example, the first through-holes 360H and the plurality of second through-holes 380H may be exposed to an outside.

Thereafter, the electrode layers 360 covering inner sidewalls of the first through-holes 360H may be formed. For example, the electrode layers 360 may conformally cover the inner sidewalls of the first through-holes 360H and may be formed so that all of the first through-holes 360H are not filled. For example, the electrode layers 360 may conformally cover the inner sidewalls of the first through-holes 360H and a portion of the first through-holes 360H may be maintained as a space penetrating from the top surface to the bottom surface of the expanded layer 300.

Figure 4E:
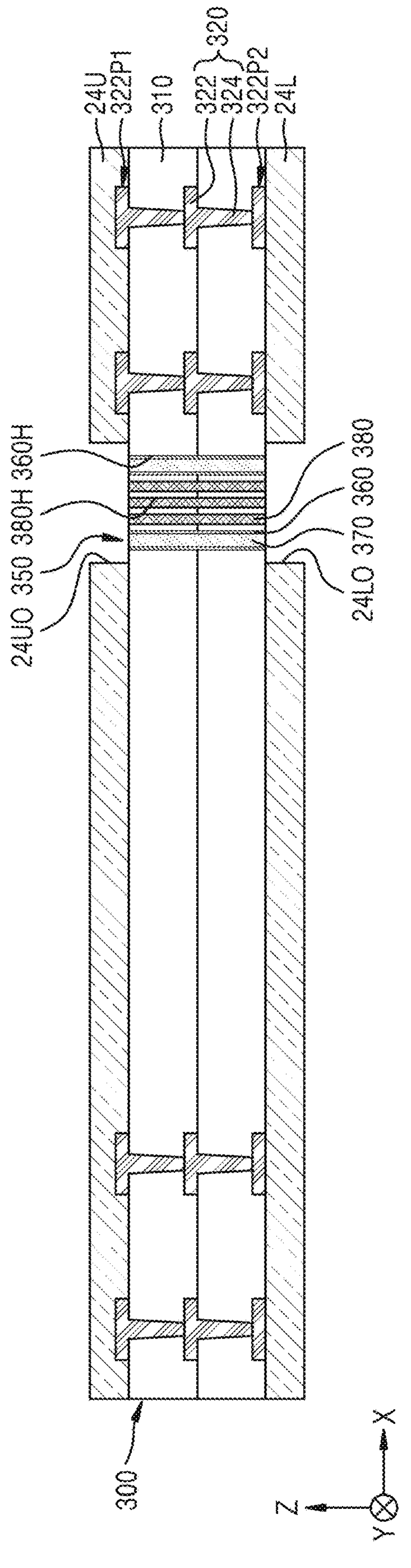

Referring to FIG. 4E, the buried capacitor structure 350 may be formed by forming the hole plugging material layer 370 filling each of the pair of first through-holes 360H. The hole plugging material layer 370 may be formed to fill the electrode layers 360 and may fill the first through-holes 360H. In some embodiments, the hole plugging material layer 370 may be formed by injecting a liquid type material into the first through-holes 360H and curing the liquid type material.

Figure 4F:
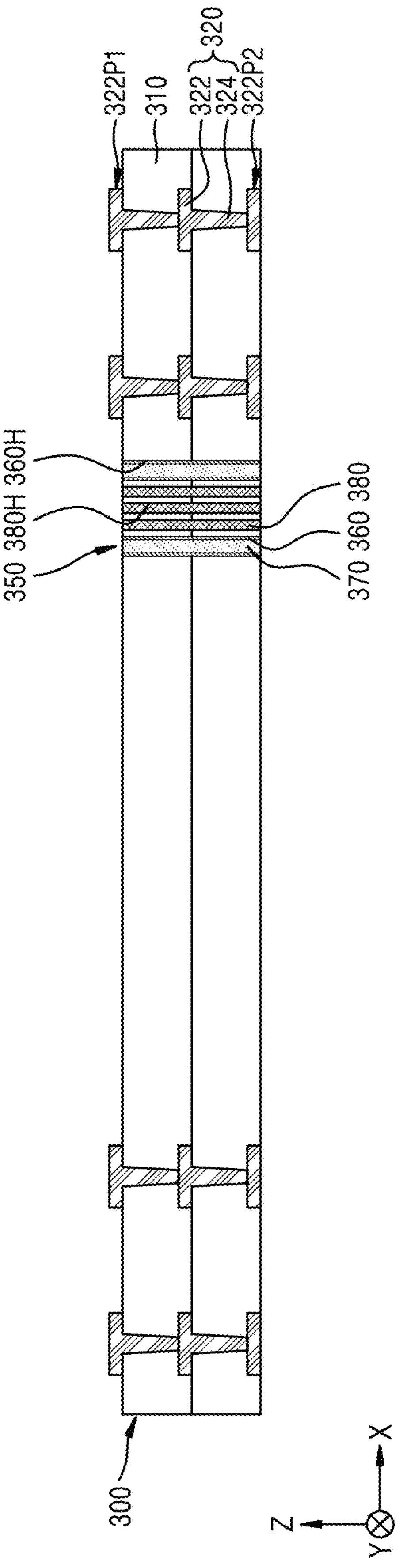

Referring to FIG. 4E and FIG. 4F together, after forming the buried capacitor structure 350, the second top surface cover layer 24U and the second bottom surface cover layer 24L may be removed. For example, the top surface expanded connection pads 322P1 and the bottom surface expanded connection pads 322P2 may be exposed.

Figure 4G:
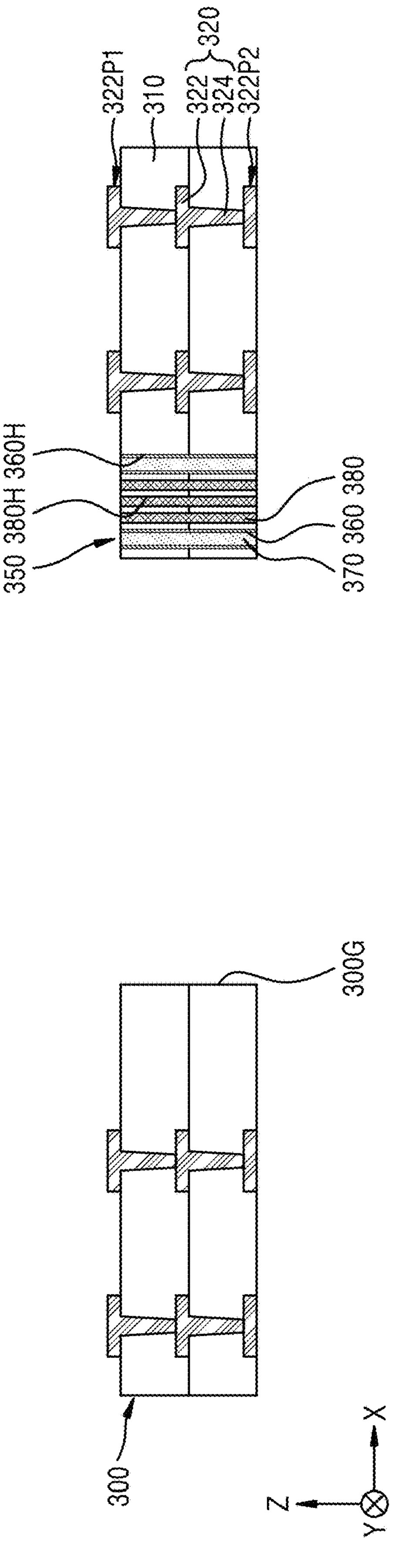

Referring to FIG. 4G, a mounting space 300G penetrating from the top surface to the bottom surface of the expanded layer 300 may be formed. Dry etching, wet etching, screen printing, drill bits, or laser drilling processes may be used to form the mounting space 300G. In some embodiments, the mounting space 300G may be formed in a central region of the expanded layer 300 in a plan view.

Figure 4H:
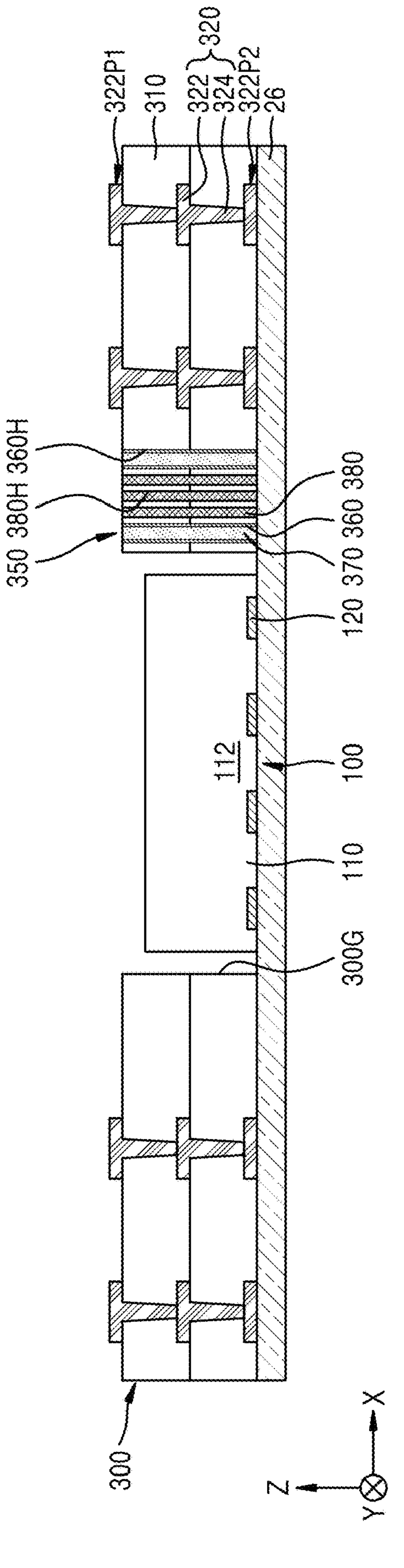

Referring to FIG. 4H, after attaching the expanded layer 300 to the support film 26, at least one semiconductor chip 100 may be disposed in the mounting space 300G. The at least one semiconductor chip 100 may be attached onto the support film 26 in the mounting space 300G. The support film 26 may be an adhesive film, but is not limited thereto. For example, the support film 26 may be a dicing film.

The at least one semiconductor chip 100 may have a face down arrangement in which the first surface on which the plurality of chip pads 120 are arranged faces the support film 26, and may be attached to the support film 26.

Figure 4I:
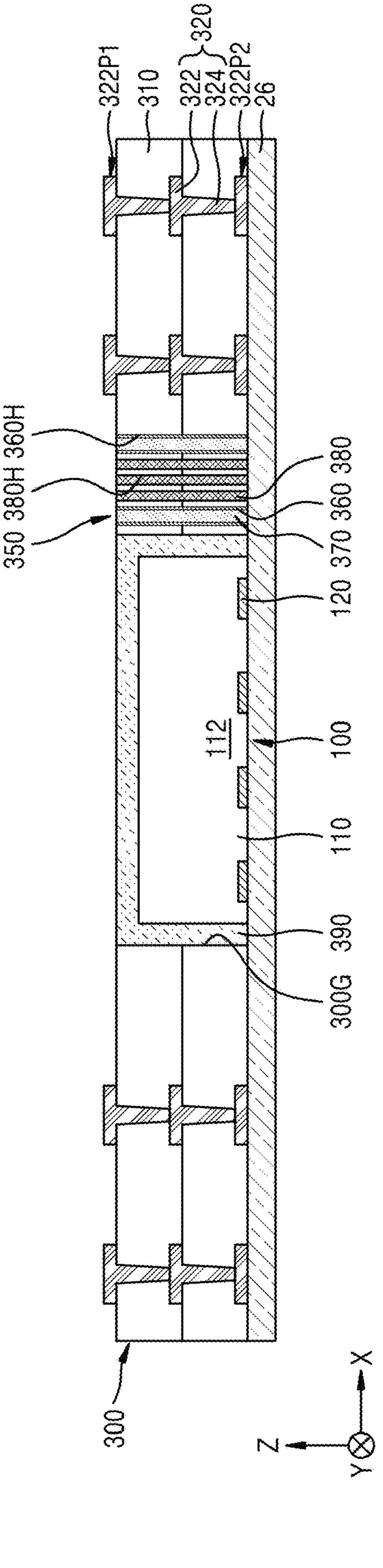

Referring to FIG. 4I, the filling insulation layer 390 may be disposed in the mounting space 300G may be formed. For example, the filling insulation layer 390 may fill the mounting space 300G. The filling insulation layer 390 may fill a space between the at least one semiconductor chip 100 disposed in the mounting space 300G and the expanded base layer 310. In some embodiments, the filling insulation layer 390 may be formed on the support film 26 to cover the side and top surfaces of the at least one semiconductor chip 100 and may fill the mounting space 300G.

After forming the filling insulation layer 390, the support film 26 may be removed.

Figure 4J:
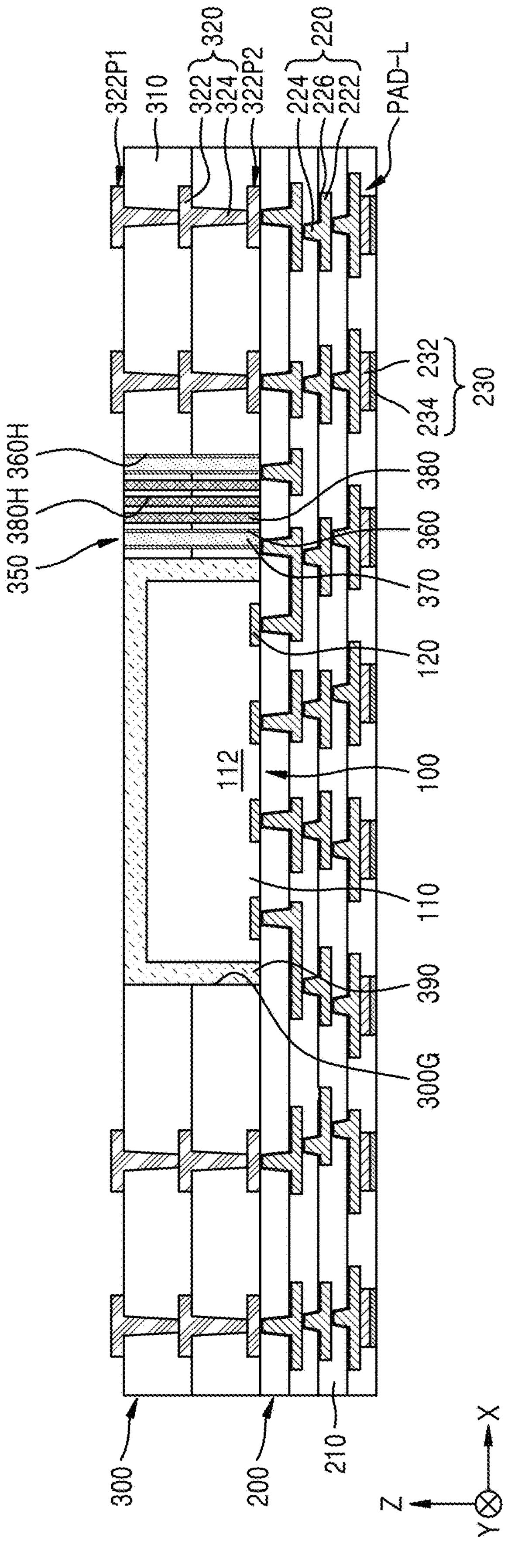

Referring to FIG. 4J, the first wiring structure 200 may be formed on the bottom surfaces of the at least one semiconductor chip 100, the expanded layer 300, and the filling insulation layer 390. The first wiring structure 200 may be formed on the at least one semiconductor chip 100, the expanded layer 300, and the filling insulation layer 390 after vertically inverting the result of FIG. 4I and the bottom surfaces of the at least one semiconductor chip 100, the expanded layer 300, and the filling insulation layer 390 may face upward.

Figure 4K:
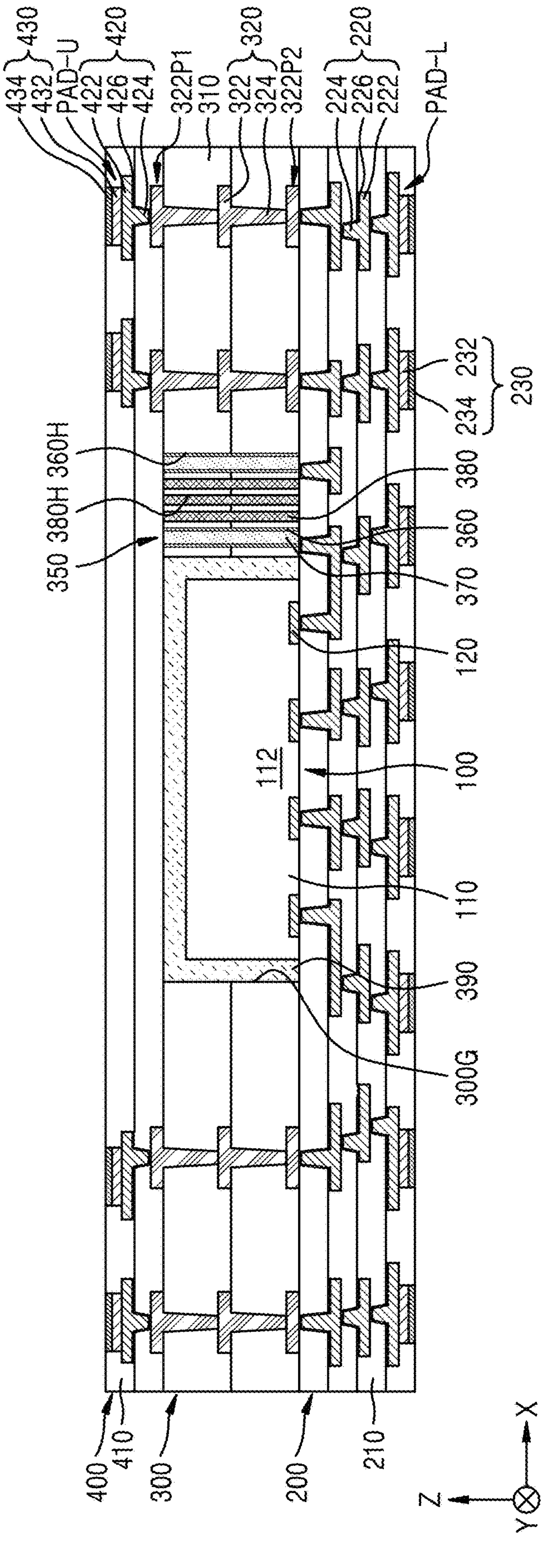

Referring to FIG. 4K, the second wiring structure 400 may be formed on top surfaces of the expanded layer 300 and the filling insulation layer 390. By vertically inverting the result obtained after forming the first wiring structure 200, the second wiring structure 400 may be formed on the expanded layer 300 and the filling insulation layer 390 after the top surfaces of the expanded layer 300 and the filling insulation layer 390 are made to face upward and the first wiring structure 200 is made to face downward.

As shown in FIG. 1A, the plurality of external connection terminals 500 may be attached to the plurality of bottom surface connection pads PAD-L to form the semiconductor package 1.

Instead of the buried capacitor structure 350 including the pair of electrode layers 360 and the plurality of dielectric layers 380 referring to FIGS. 4A to 4K, when the buried capacitor structure 350*a* including the pair of electrode layers 360 and one dielectric layer 380 shown in FIG. 2A and FIG. 2B is formed, the semiconductor package 1*a* shown in FIG. 2A and FIG. 2B may be formed.

FIGS. 5A to 5G are cross-sectional views illustrating a method of manufacturing a semiconductor package that is a fan-out panel level package according to embodiments; FIGS. 5A to 5G are cross-sectional views illustrating a method of manufacturing the semiconductor package 1*a* shown in FIG. 2A and FIG. 2B, and redundant descriptions with reference to FIG. 2A and FIGS. 2B and 4A to 4K may be omitted.

Figure 5A:
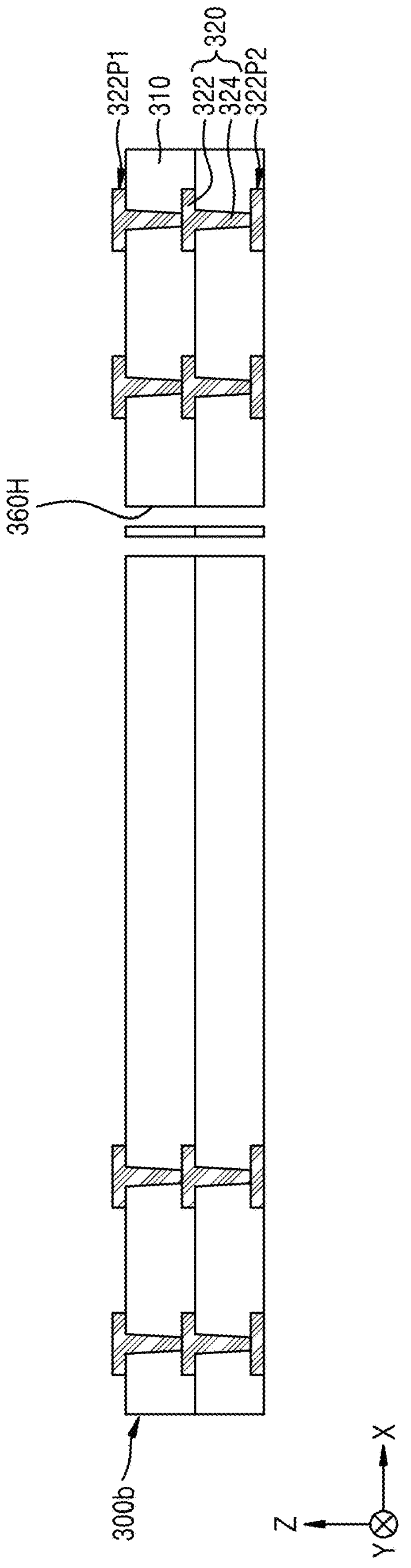
FIGS. 5A, 5B, 5C, 5D, 5E, 5F, and 5G are cross-sectional views illustrating a method of manufacturing a semiconductor package that is a fan-out panel level package, according to embodiments.

Referring to FIG. 5A, an expanded layer 300*b* including an expanded base layer 310 and a plurality of via structures 320 may be prepared, and a pair of first through-holes 360H spaced apart from each other while penetrating the expanded base layer 310 may be formed.

Figure 5B:
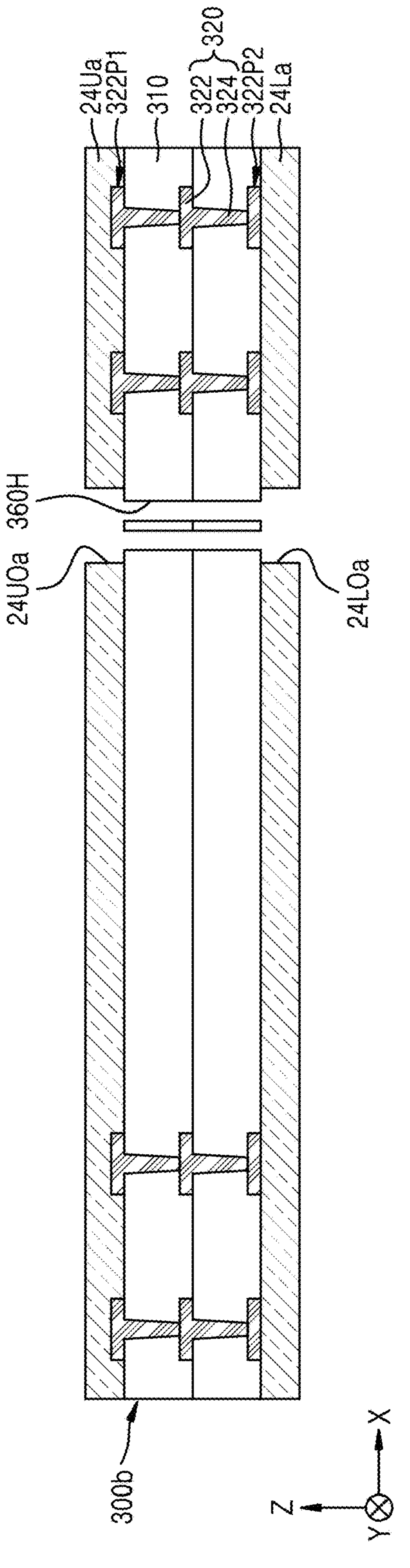

Referring to FIG. 5B, a top surface cover layer 24Ua and a bottom surface cover layer 24La covering the top and bottom surfaces of the expanded layer 300*b* may be formed. Each of the top surface cover layer 22Ua and the bottom surface cover layer 22La may be an adhesive film, but is not limited thereto. For example, the top surface cover layer 24Ua and the bottom surface cover layer 24La may include a dicing film. The top surface cover layer 24Ua and the bottom surface cover layer 24La may respectively have a top surface opening 24UOa and a bottom surface opening 24LOa corresponding to each other. The top surface opening 24UOa and the bottom surface opening 24LOa may correspond to the pair of first through-holes 360H. For example, the top surface cover layer 24Ua having the top surface opening 24UOa and the bottom surface cover layer 24La having the bottom surface opening 24LOa may cover the top and bottom surfaces of the expanded layer 300*b* and may expose the first through-holes 360H without covering the first through-holes 360H. For example, the first through-holes 360H may be exposed to an outside.

Figure 5C:
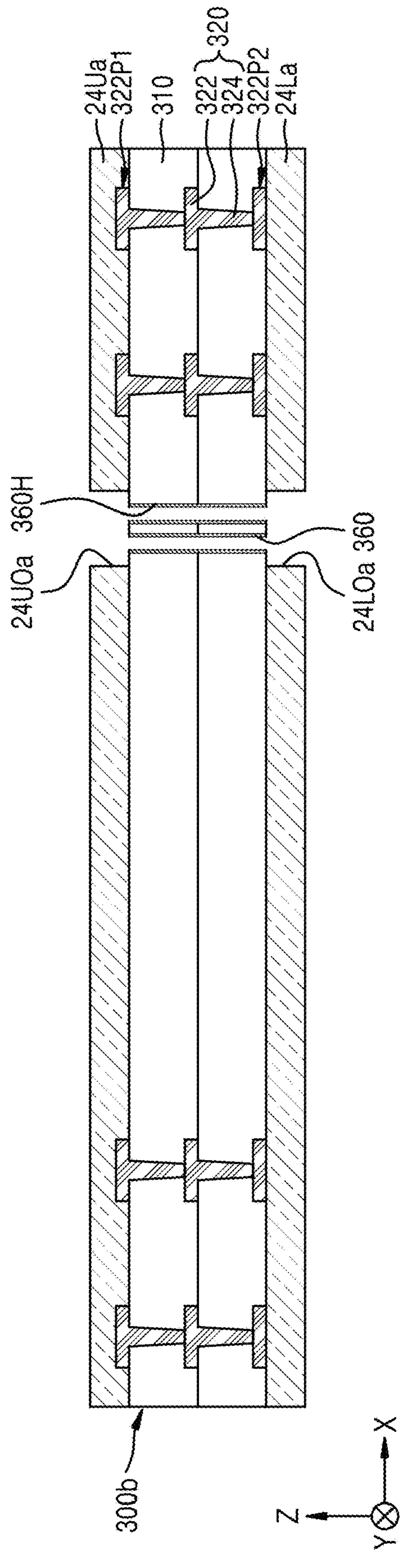

Referring to FIG. 5C, the pair of electrode layers 360 covering inner sidewalls of the pair of first through-holes 360H may be formed. For example, the pair of electrode layers 360 conformally cover the inner sidewalls of the pair of first through-holes 360H and may be formed so that all of the pair of first through-holes 360H are not filled.

Figure 5D:
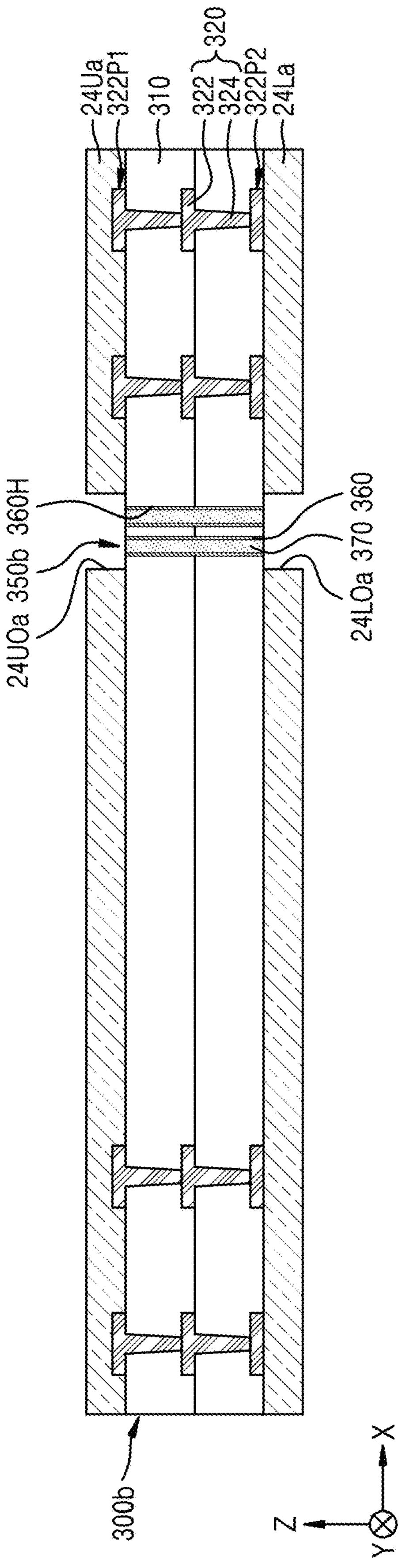

Referring to FIG. 5D, the buried capacitor structure 350*b* may be formed by forming the hole plugging material layer 370 filling each of the pair of first through-holes 360H. The hole plugging material layer 370 may be formed to fill the electrode layers 360 and may fill the first through-holes 360H. After the buried capacitor structure 350*b* is formed, the top surface cover layer 24Ua and the bottom surface cover layer 24La may be removed.

Figure 5E:
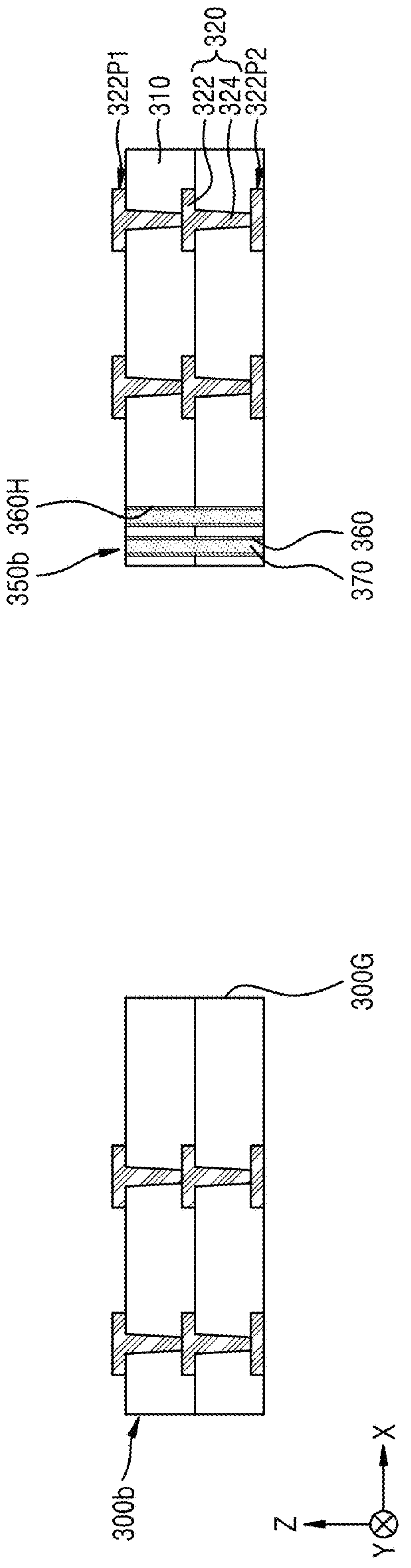

Referring to FIG. 5E, a mounting space 300G penetrating from the top surface to the bottom surface of the expanded layer 300*b* may be formed. In some embodiments, the mounting space 300G may be formed in a central region of the expanded layer 300*b* in a plan view.

Figure 5F:
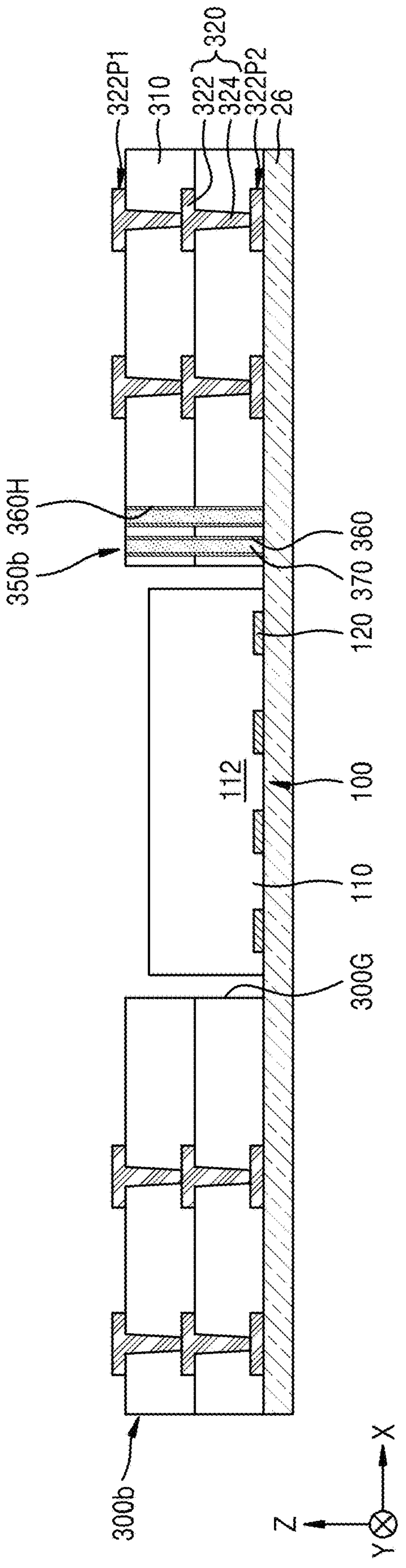

Referring to FIG. 5F, after attaching the expanded layer 300*b* to the support film 26, at least one semiconductor chip 100 may be disposed in the mounting space 300G. The at least one semiconductor chip 100 may be attached onto the support film 26 in the mounting space 300G. The at least one semiconductor chip 100 may have a face down arrangement in which the first surface on which the plurality of chip pads 120 may be disposed to face the support film 26, and may be attached to the support film 26.

Figure 5G:
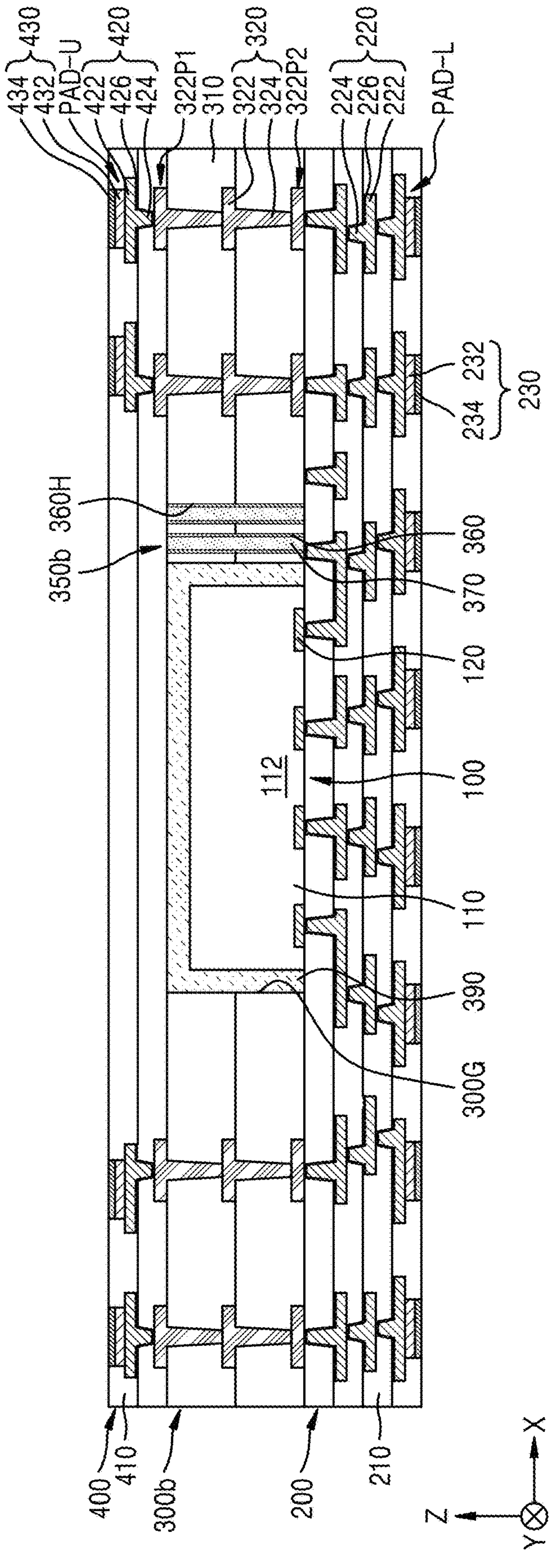

Referring to FIG. 5F and FIG. 5G, the filling insulation layer 390 filling the mounting space 300G may be formed. After forming the filling insulation layer 390, the support film 26 may be removed.

After forming the filling insulation layer 390, the first wiring structure 200 may be formed on the bottom surfaces of the at least one semiconductor chip 100, the expanded layer 300*b*, and the filling insulation layer 390, and the second wiring structure 400 may be formed on the top surface of the expanded layer 300*b* and the filling insulation layer 390.

Thereafter, as shown in FIG. 3A, the plurality of external connection terminals 500 may be attached to the plurality of bottom surface connection pads PAD-L to form the semiconductor package 1*b*.

Figure 6A:
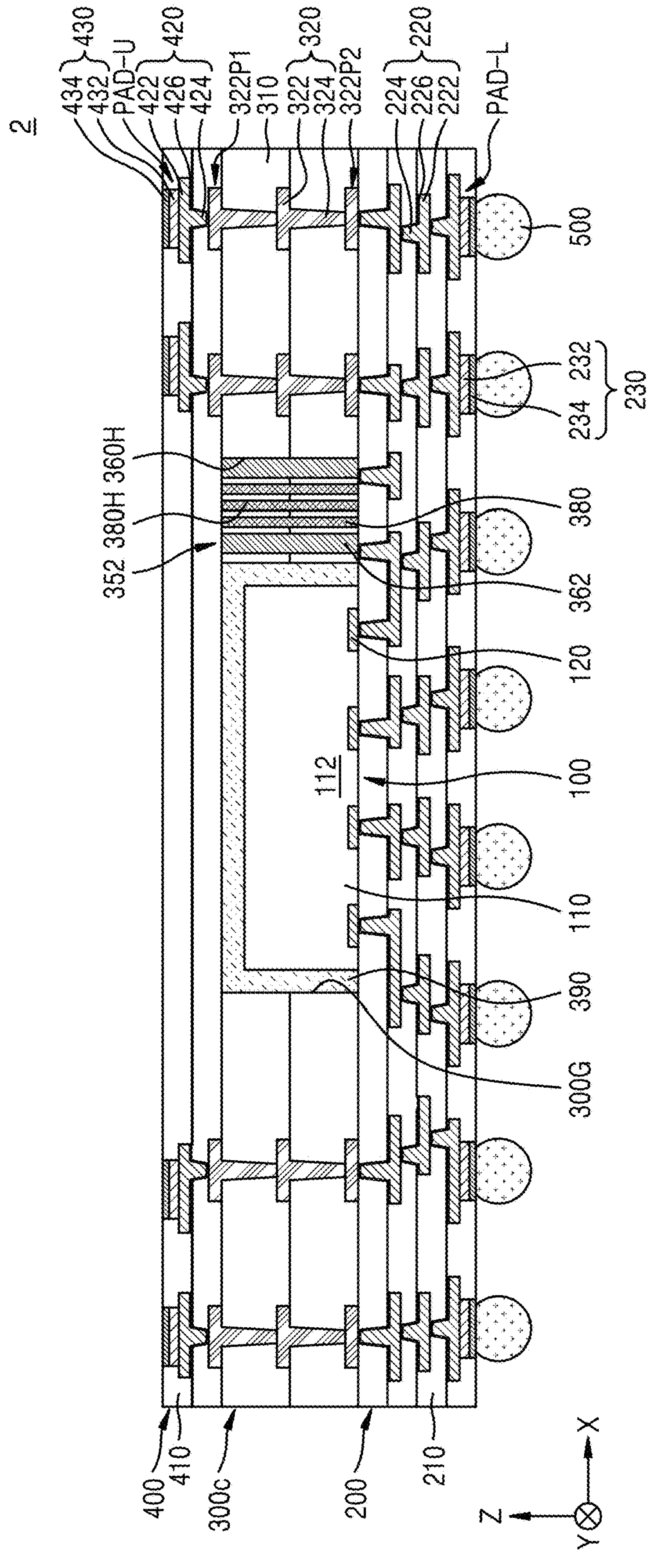
FIG. 6A is a cross-sectional view of a semiconductor package that is a fan-out panel level package, according to embodiments.
Figure 6B:
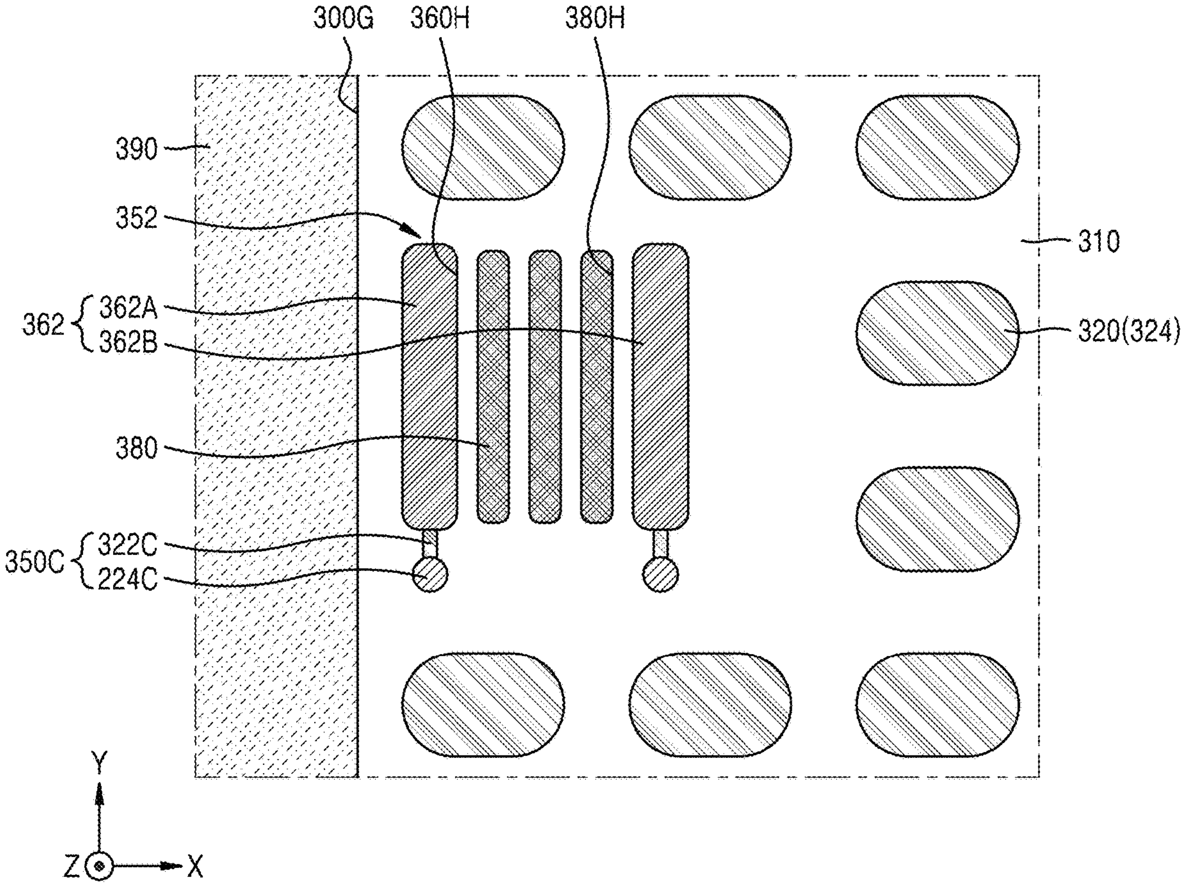
FIG. 6B is an enlarged plan view showing part of the semiconductor package of FIG. 6A.

FIG. 6A is a cross-sectional view of a semiconductor package that is a fan-out panel level package according to embodiments, and FIG. 6B is an enlarged plan view showing a part of the semiconductor package. In FIG. 6A and FIG. 6B, redundant descriptions with reference to FIG. 1A and FIG. 1B may be omitted.

Referring to FIG. 6A and FIG. 6B together, the semiconductor package 2 may include a first wiring structure 200, a second wiring structure 400 on the first wiring structure 200, at least one semiconductor chip 100 disposed between the first wiring structure 200 and the second wiring structure 400, and an expanded layer 300*c* disposed between the first wiring structure 200 and the second wiring structure 400 and surrounding the at least one semiconductor chip 100. The expanded layer 300*c* may electrically connect the first wiring structure 200 and the second wiring structure 400 with each other. The expanded layer 300*c* may have a mounting space 300G in which at least one semiconductor chip 100 is arranged. The expanded layer 300 may include an expanded base layer 310 and a plurality of via structures 320.

The semiconductor package 2 may include a buried capacitor structure 352. The buried capacitor structure 352 may be buried in the expanded base layer 310. The buried capacitor structure 352 may include a plurality of electrode layers 362 spaced apart from each other and a plurality of dielectric layers 380 disposed between the pair of electrode layers 362 and spaced apart from each other. The plurality of dielectric layers 380 may be spaced apart from the electrode layers 362. The electrode layers 362 may be disposed in the first through-holes 360H penetrating the expanded base layer 310. For example, a pair of electrode layers 362 may fill a pair of first through-holes 360H penetrating the expanded base layer 310. For example, the electrode layers 362 may fill all of the first through-holes 360H corresponding thereto. In some embodiments, the buried capacitor structure 352 may be electrically connected to the semiconductor chip 100 through the pair of capacitor connection structures 350C. In some embodiments, the buried capacitor structure 352 may be electrically connected to components including the plurality of via structures 320 included in the expanded layer 300*c* through the pair of capacitor connection structures 350C.

Although not shown separately, the buried capacitor structure 352 included in the semiconductor package 2 may include one dielectric layer 380, instead of the plurality of dielectric layers 380, in the same manner as the buried capacitor structure 350*a* included in the semiconductor packages 1*a* shown in FIG. 2A and FIG. 2B.

Figure 7A:
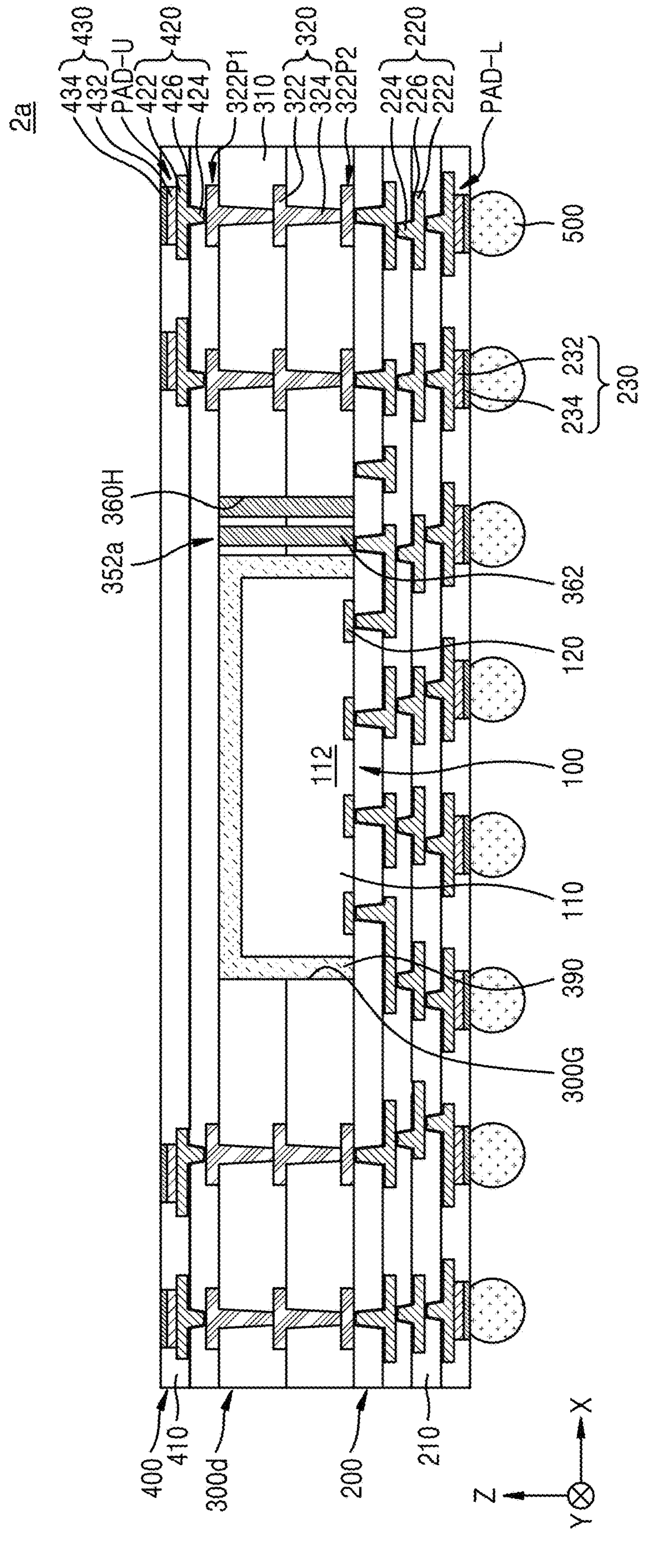
FIG. 7A is a cross-sectional view of a semiconductor package that is a fan-out panel level package, according to embodiments.
Figure 7B:
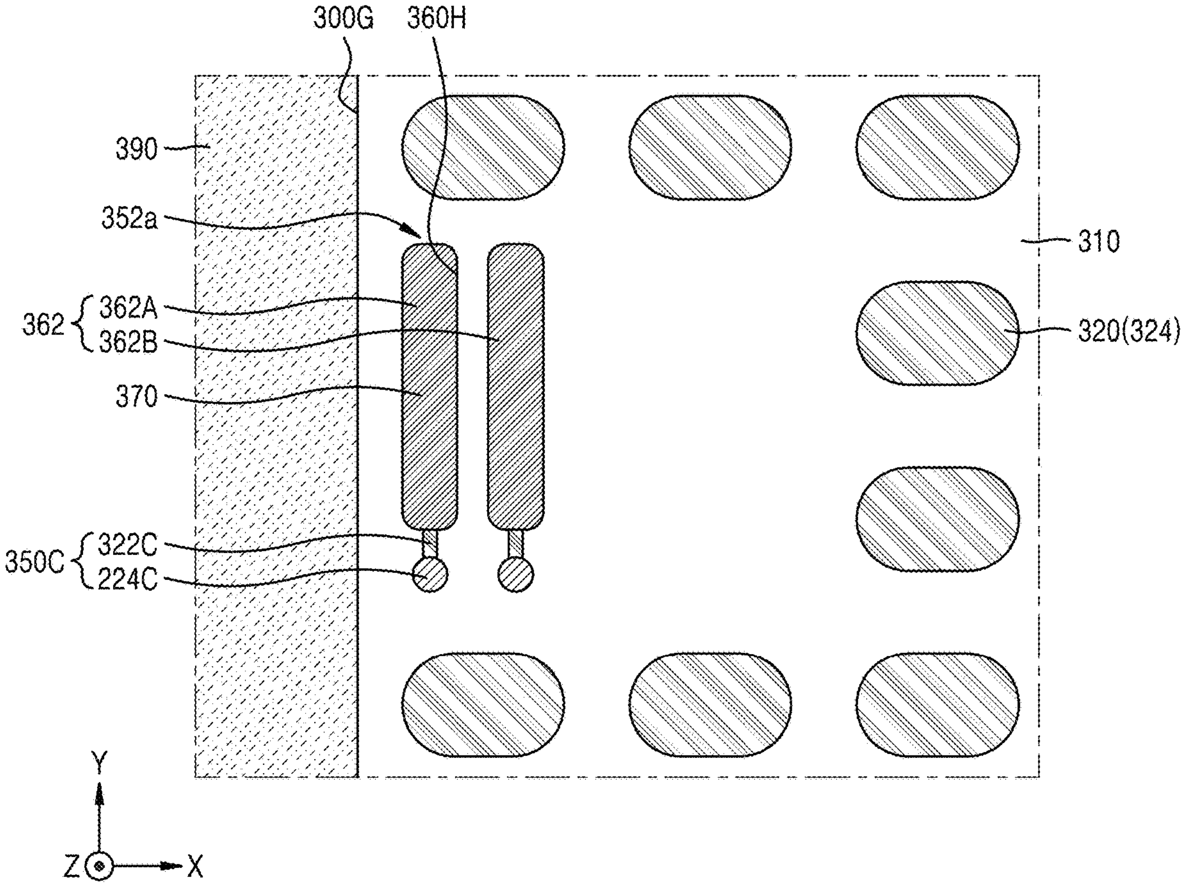
FIG. 7B is an enlarged plan view showing a part of the semiconductor package of FIG. 7A.

FIG. 7A is a cross-sectional view of a semiconductor package that is a fan-out panel level package according to embodiments, and FIG. 7B is an enlarged plan view showing a part of the semiconductor package; In FIG. 7A and FIG. 7B, redundant descriptions with reference to FIG. 3A and FIG. 3B may be omitted.

Referring to FIG. 7A and FIG. 7B together, the semiconductor package 2*a* may include a first wiring structure 200, a second wiring structure 400 on the first wiring structure 200, at least one semiconductor chip 100 arranged between the first wiring structure 200 and the second wiring structure 400, and an expanded layer 300*d* arranged between the first wiring structure 200 and the second wiring structure 400 and surrounding the at least one semiconductor chip 100. The expanded layer 300*d* may electrically connect the first wiring structure 200 and the second wiring structure 400 with each other. The expanded layer 300*d* may have a mounting space 300G in which at least one semiconductor chip 100 may be disposed. The expanded layer 300*d* may include an expanded base layer 310 and a plurality of via structures 320.

The semiconductor package 1*b* may include a buried capacitor structure 352*a*. The buried capacitor structure 352*a* may be buried in the expanded base layer 310. The buried capacitor structure 352*a* may include a pair of electrode layers 362 spaced apart from each other. In some embodiments, the pair of electrode layers 362 may fill the pair of first through-holes 360H penetrating the expanded base layer 310. For example, the pair of electrode layers 362 may fill all of the pair of first through-holes 360H corresponding thereto. In some embodiments, the buried capacitor structure 352*a* may be electrically connected to the semiconductor chip 100 through the pair of capacitor connection structures 350C. In some embodiments, the buried capacitor structure 352*a* may be electrically connected to components including the plurality of via structures 320 included in the expanded layer 300*d* through the pair of capacitor connection structures 350C.

FIGS. 8A to 8H are plan views illustrating a semiconductor package that is a fan-out panel level package according to embodiments; and FIGS. 8A to 8H are plan views illustrating the semiconductor package 1 shown in FIG. 1A and FIG. 1B, and redundant descriptions with reference to FIG. 1A and FIG. 1B may be omitted.

Figure 8A:
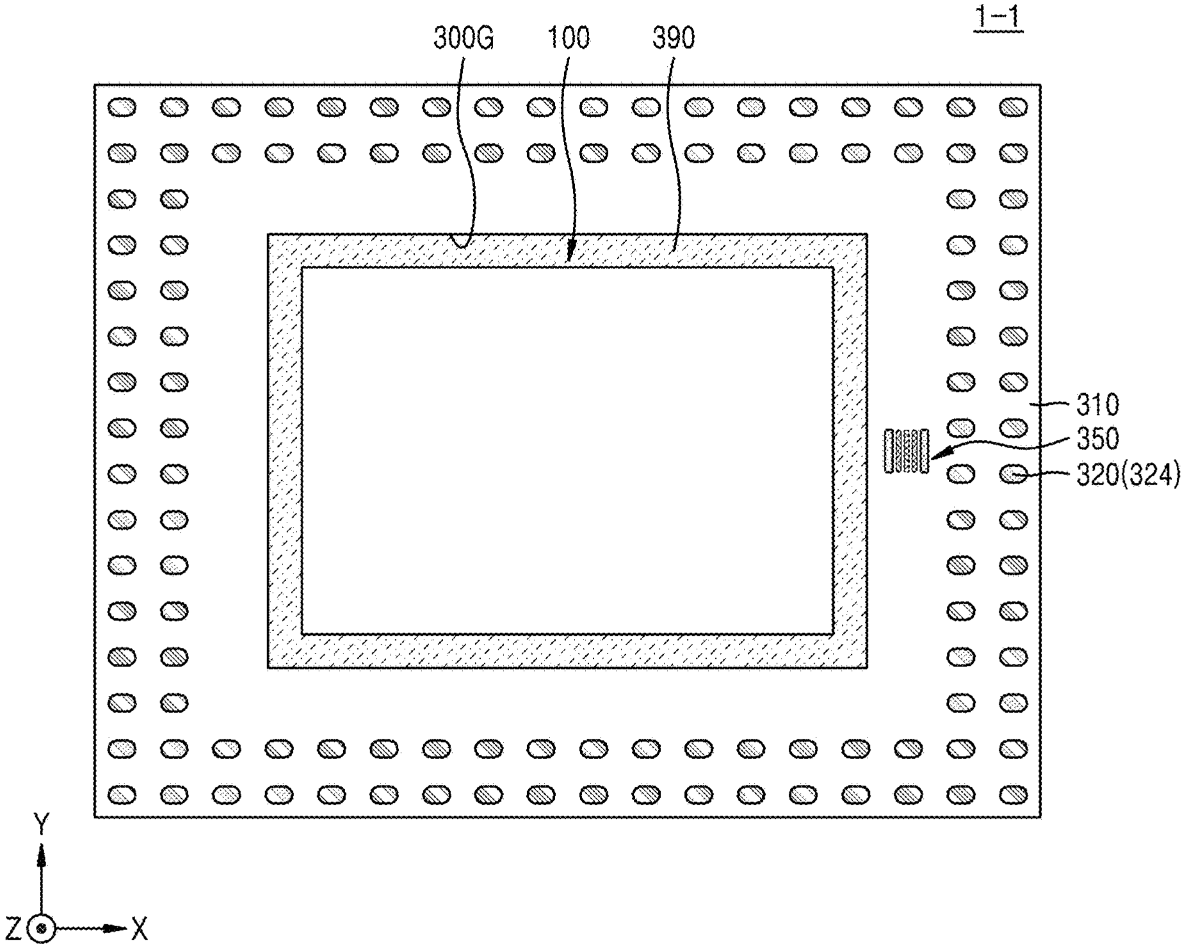
FIGS. 8A, 8B, 8C, 8D, 8E, 8F, 8G, and 8H are plan views illustrating a semiconductor package that is a fan-out panel level package, according to embodiments.

Referring to FIG. 8A, a semiconductor package 1-1 may include a semiconductor chip 100 and a buried capacitor structure 350 buried in the expanded base layer 310 adjacent to the semiconductor chip 100. The buried capacitor structure 350 may be arranged adjacent to a center portion of the side surface of the semiconductor chip 100 in a plan view.

Figure 8B:
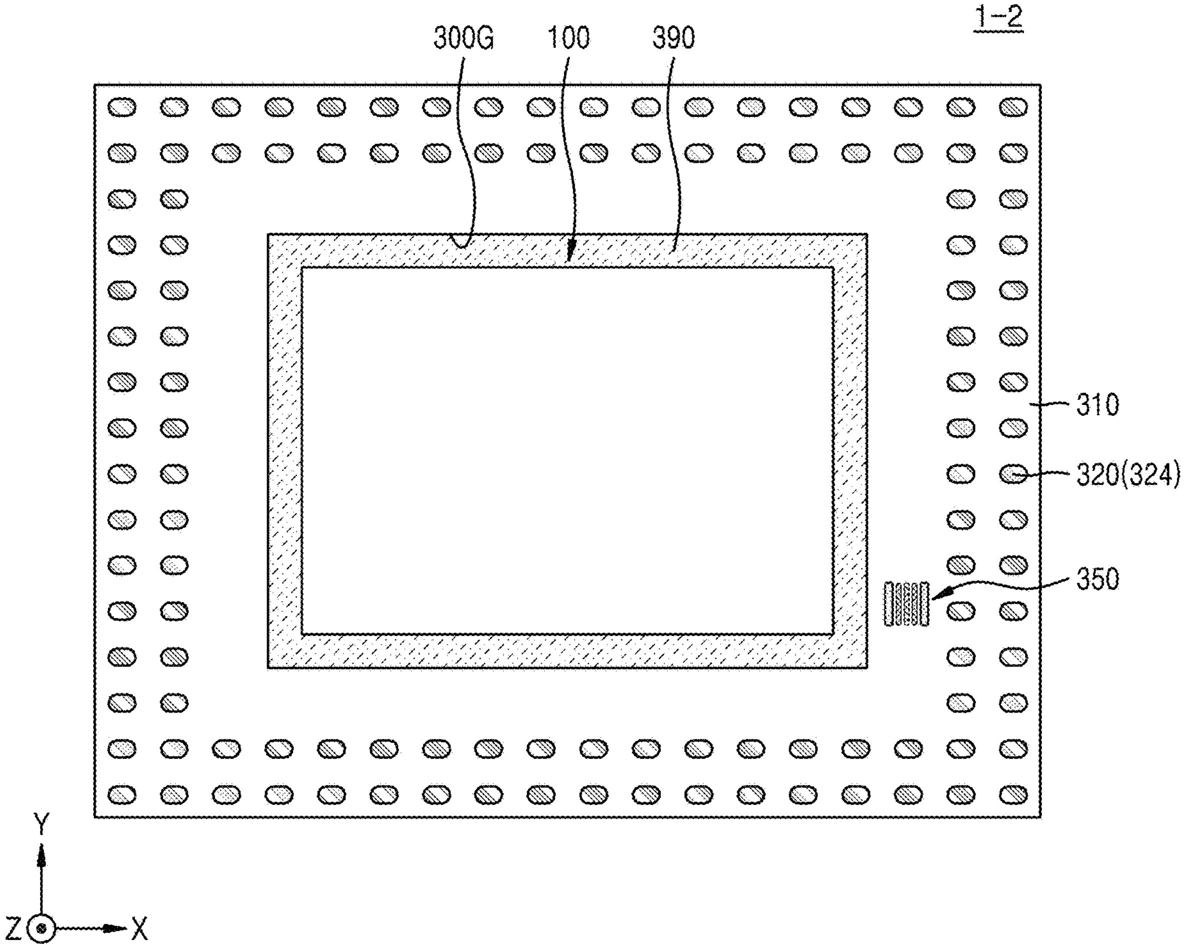

Referring to FIG. 8B, a semiconductor package 1-2 may include a semiconductor chip 100 and a buried capacitor structure 350 buried in the expanded base layer 310 adjacent to the semiconductor chip 100. The buried capacitor structure 350 may be arranged adjacent to an edge of the semiconductor chip 100 in a plan view. For example, when the buried capacitor structure 350 is placed adjacent to the first horizontal direction (X direction) side from the semiconductor chip 100 in a plan view, the buried capacitor structure 350 may be positioned to overlap at least a portion of the semiconductor chip 100 in the first horizontal direction (X direction).

Figure 8C:
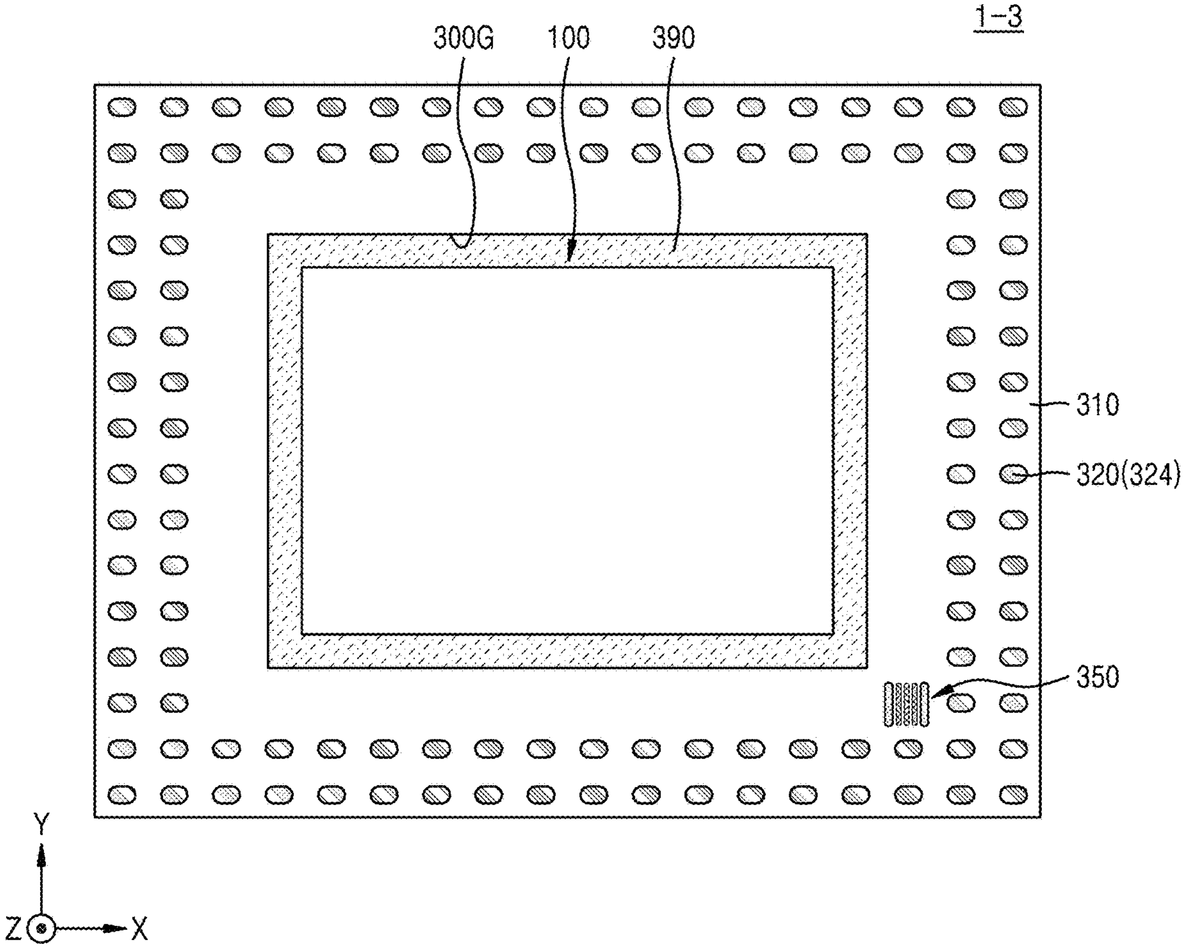

Referring to FIG. 8C, a semiconductor package 1-3 may include a semiconductor chip 100 and a buried capacitor structure 350 buried in the expanded base layer 310 adjacent to the semiconductor chip 100. The buried capacitor structure 350 may be arranged adjacent to an edge of the semiconductor chip 100 in a plan view. In some embodiments, the buried capacitor structure 350 in a plan view may be disposed adjacent to an oblique direction side from the semiconductor chip 100 with respect to the first horizontal direction (X direction) and the second horizontal direction (Y direction) so as not to overlap the semiconductor chip 100 in both the first horizontal direction (X direction) and the second horizontal direction (Y direction).

Figure 8D:
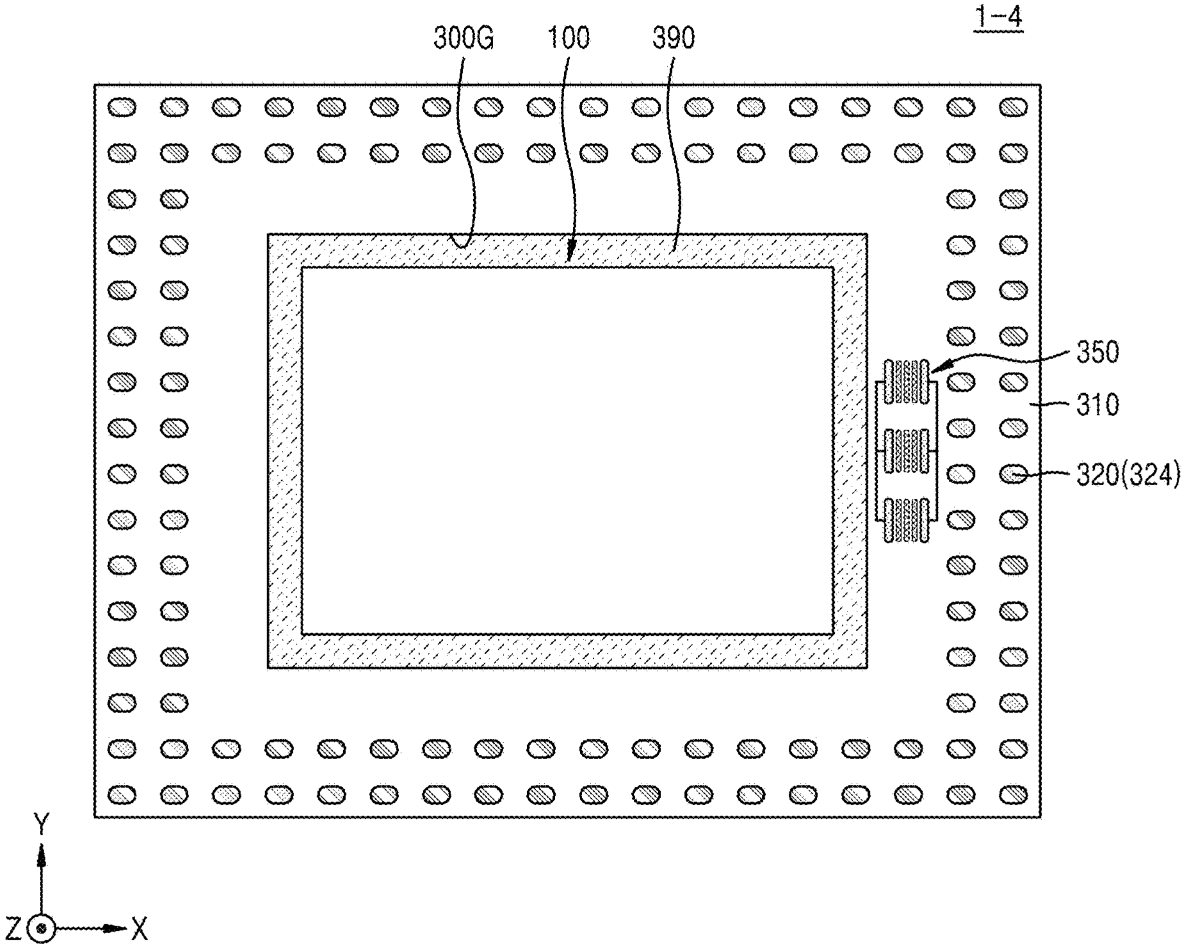

Referring to FIG. 8D, a semiconductor package 1-4 may include a semiconductor chip 100 and at least two buried capacitor structures 350 buried in the expanded base layer 310 adjacent to the semiconductor chip 100. The at least two buried capacitor structures 350 may be arranged adjacent to a center portion of the side surface of the semiconductor chip 100 in a plan view. In some embodiments, the at least two buried capacitor structures 350 may be placed in the center portion of the side of the semiconductor chip 100 in a plan view, sequentially spaced apart from each other in the extension direction of the side of the semiconductor chip 100. In some embodiments, the at least two buried capacitor structures 350 may be connected in parallel with each other.

Figure 8E:
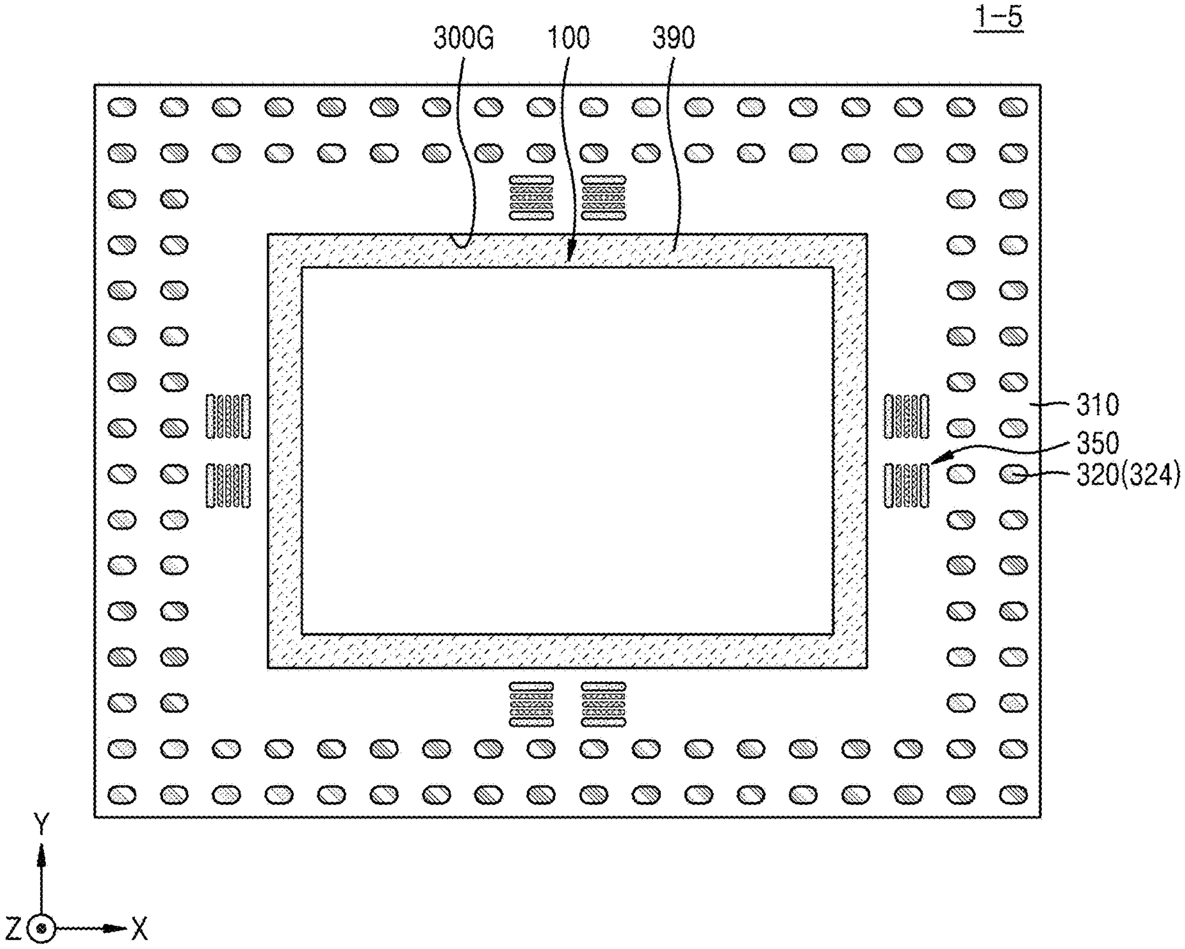

Referring to FIG. 8E, a semiconductor package 1-5 may include a semiconductor chip 100 and a plurality of buried capacitor structures 350 buried in the expanded base layer 310 adjacent to the semiconductor chip 100. Each of the plurality of buried capacitor structures 350 may be arranged adjacent to the center portion of the side surface of the semiconductor chip 100 in a plan view. In some embodiments, the plurality of buried capacitor structures 350 may have central portions of at least two of the four side surfaces of the semiconductor chip 100, disposed adjacent to each other in a plan view. In some embodiments, at least two buried capacitor structures 350 may be disposed sequentially spaced apart from each other in the extension direction of at least one side surface in a central portion of at least one of the four side surfaces of the semiconductor chip 100 in a plan view. Although not shown separately, at least two buried capacitor structures 350 arranged adjacent to the central portion of at least one of the four side surfaces of the semiconductor chip 100 may be connected in parallel with the at least two buried capacitor structures 350 shown in FIG. 8D.

Figure 8F:
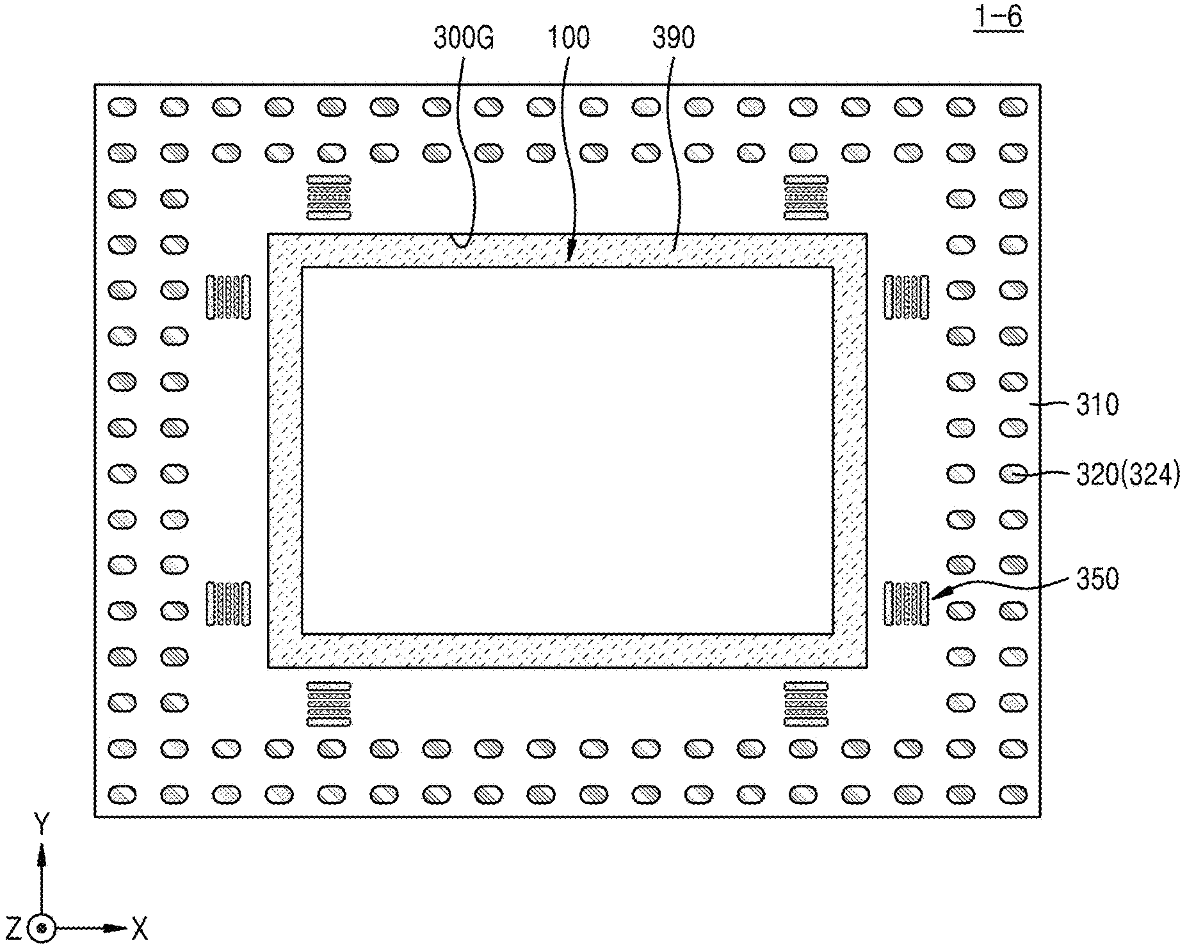

Referring to FIG. 8F, a semiconductor package 1-6 may include a semiconductor chip 100 and a plurality of buried capacitor structures 350 buried in the expanded base layer 310 adjacent to the semiconductor chip 100. Each of the plurality of buried capacitor structures 350 may be disposed adjacent to an edge of the semiconductor chip 100 in a plan view. For example, when the buried capacitor structure 350 is disposed adjacent to the first horizontal direction (X direction) side from the semiconductor chip 100 in a plan view, the buried capacitor structure 350 may be positioned to overlap at least a portion of the semiconductor chip 100 in the first horizontal direction (X direction), and when the buried capacitor structure 350 is disposed adjacent to the second horizontal direction (Y direction) side from the semiconductor chip 100 in a plan view, the buried capacitor structure 350 may be positioned to overlap the semiconductor chip 100 in the second horizontal direction (Y direction). The buried capacitor structures 350 may be positioned to completely overlap an edge the semiconductor chip 100 in either the first horizontal direction (X direction) or the second horizontal direction (Y direction).

Figure 8G:
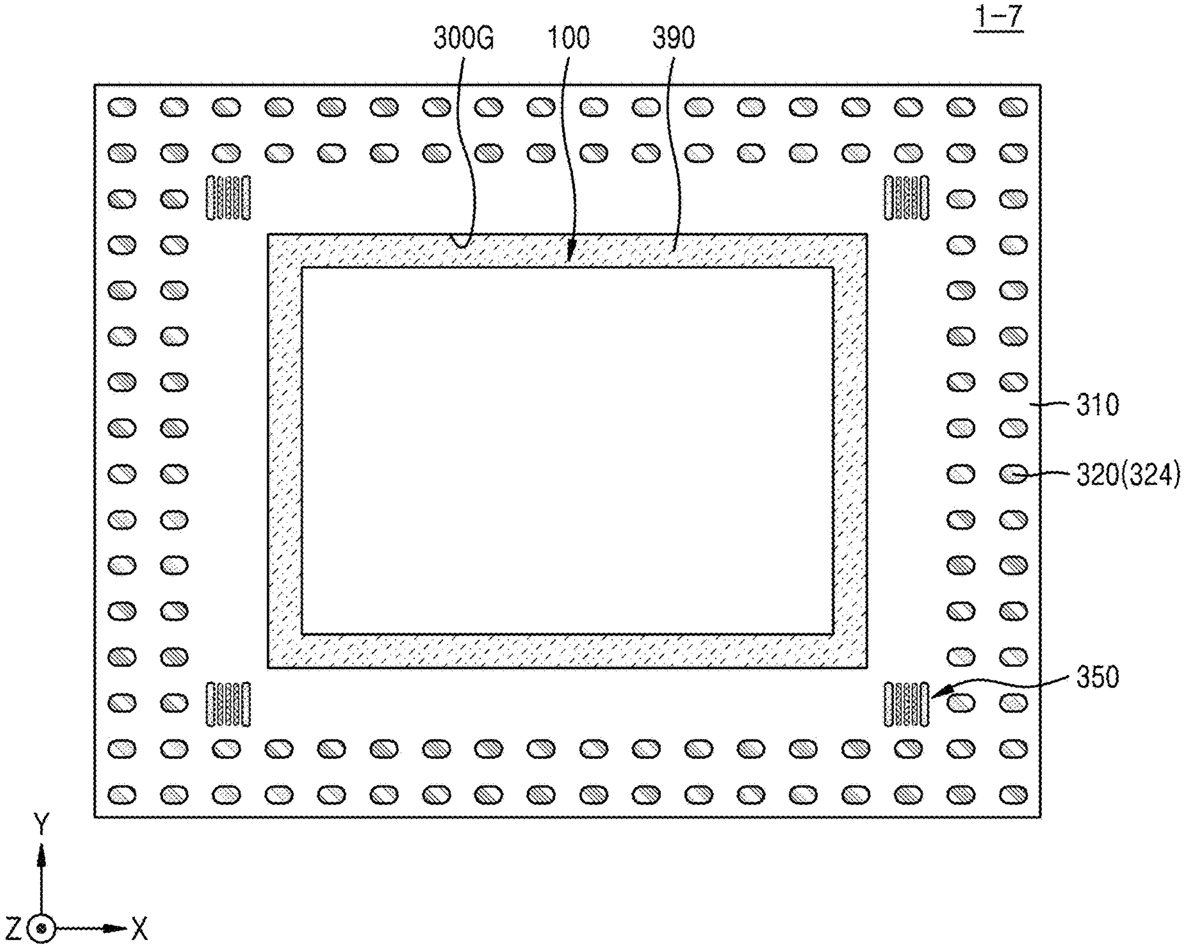

Referring to FIG. 8G, a semiconductor package 1-7 may include a semiconductor chip 100 and a plurality of buried capacitor structures 350 buried in the expanded base layer 310 adjacent to the semiconductor chip 100. Each of the plurality of buried capacitor structures 350 may be arranged adjacent to any one of the edges of the semiconductor chip 100 in a plan view. In some embodiments, each of the plurality of the buried capacitor structures 350 in a plan view may be disposed adjacent to an oblique direction side from the semiconductor chip 100 with respect to the first horizontal direction (X direction) and the second horizontal direction (Y direction) and may not overlap the semiconductor chip 100 in either the first horizontal direction (X direction) and the second horizontal direction (Y direction). For example, the plurality of buried capacitor structures 350 may be disposed at respective corners of the semiconductor chip 100, and may be disposed away from sides of the semiconductor chip 100.

Figure 8H:
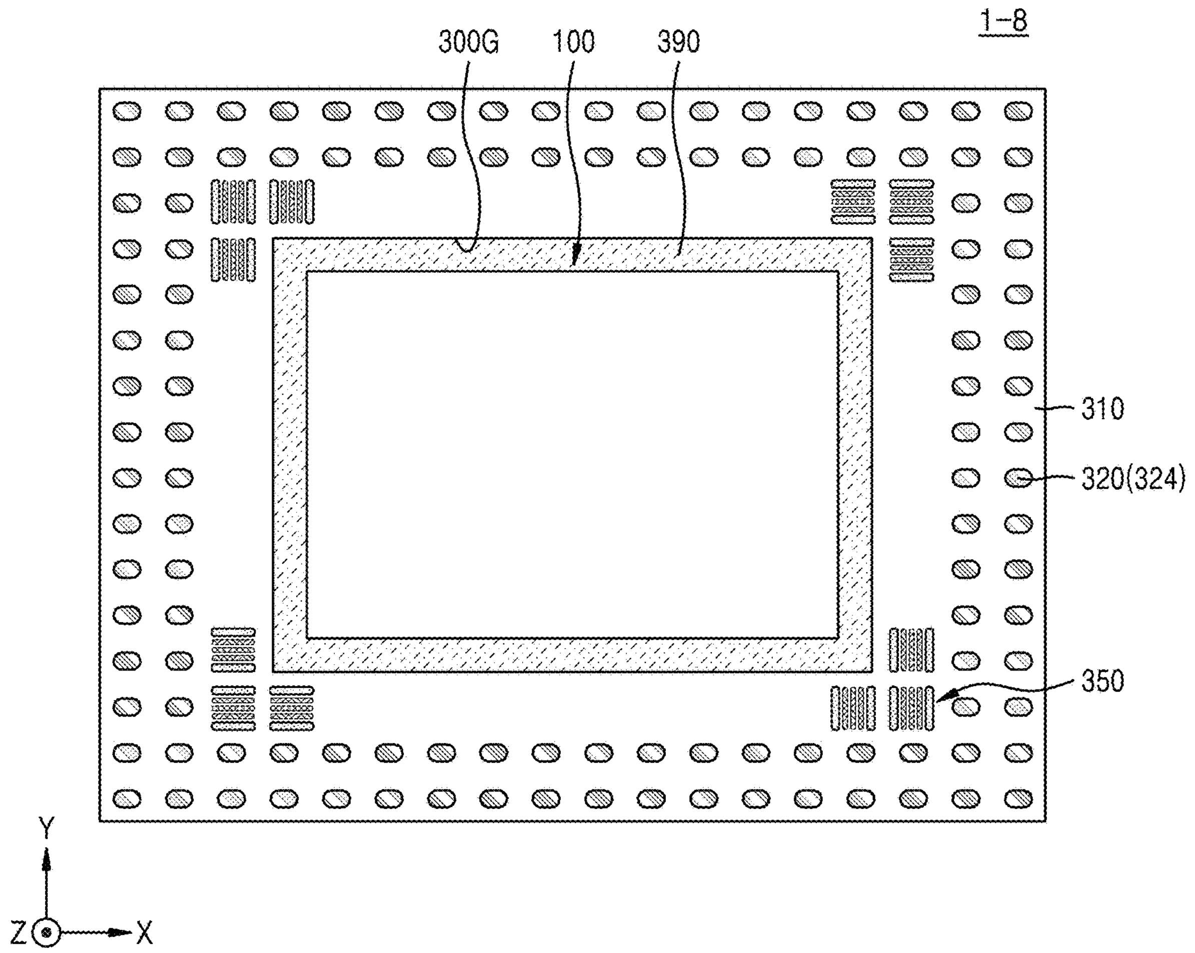

Referring to FIG. 8H, a semiconductor package 1-8 may include a semiconductor chip 100 and a plurality of buried capacitor structures 350 buried in the expanded base layer 310 adjacent to the semiconductor chip 100. At least two of the plurality of buried capacitor structures 350 may be arranged adjacent to any one of the edges of the semiconductor chip 100 in a plan view. In some embodiments, each of the plurality of the buried capacitor structures 350 in a plan view may be disposed adjacent to an oblique direction side from the semiconductor chip 100 with respect to the first horizontal direction (X direction) and the second horizontal direction (Y direction) and may not overlap the semiconductor chip 100 in either the first horizontal direction (X direction) or the second horizontal direction (Y direction). For example, at least one of the buried capacitor structures 350 may be disposed at a corner of the semiconductor chip 100, and disposed away from sides of the semiconductor chip 100.

Although not shown separately, instead of the buried capacitor structure 350 included in each of the semiconductor packages 1-1, 1-2, 1-3, 1-4, 1-5, 1-6, 1-7, and 1-8 shown in FIGS. 8A to 8H, it would be obvious to those skilled in the art in view of the present disclosure to apply the buried capacitor structures 350*a* shown in FIG. 2A and FIG. 2B, the buried capacitor structures 350*b* shown in FIGS. 3A and 3B, the buried capacitor structures 352 shown in FIG. 6A and FIG. 6B, and the buried capacitor structures 352*a* shown in FIG. 7A and FIG. 7B.

Figure 9:
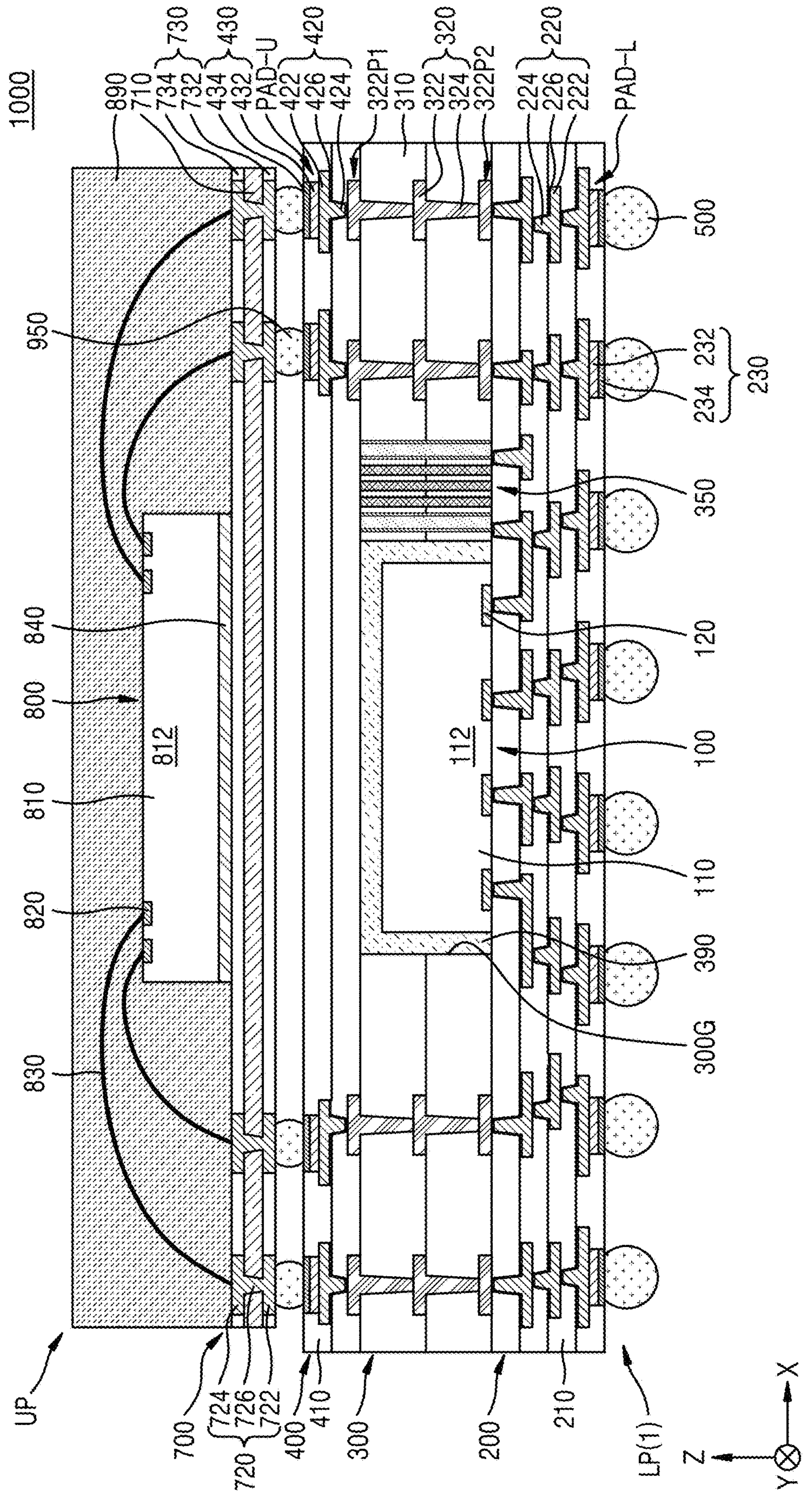
FIG. 9 is a cross-sectional view of a semiconductor package that is a package-on-package, according to embodiments.

FIG. 9 is a cross-sectional view of a semiconductor package that is a package-on-package according to embodiments. In FIG. 9, redundant descriptions with reference to FIGS. 1A and 8H may be omitted.

Referring to FIG. 9, the semiconductor package 1000 may include a package-on-package (PoP) including a lower package LP and an upper package UP attached to the lower package LP. The lower package LP may be the semiconductor package 1 shown in FIG. 1A and FIG. 1B, but is not limited thereto. For example, the lower package LP may be any one of the semiconductor packages 1*a* shown in FIG. 2A and FIG. 2B, the semiconductor packages 1*b* shown in FIG. 3A and FIG. 3B, the semiconductor packages 2 shown in FIG. 6A and FIG. 6B, the semiconductor packages 2*a* shown in FIG. 7A and FIG. 7B, and the semiconductor packages 1-1, 1-2, 1-3, 1-4, 1-5, 1-6, 1-7, and 1-8 respectively shown in FIGS. 8A to 8H.

The lower package LP may include a first wiring structure 200, a second wiring structure 400 on the first wiring structure 200, at least one semiconductor chip 100 arranged between the first wiring structure 200 and the second wiring structure 400, and an expanded layer 300 arranged between the first wiring structure 200 and the second wiring structure 400 and surrounding the periphery of the at least one semiconductor chip 100.

The upper package UP may be attached to the second wiring structure 400. The upper package UP may be electrically connected to a plurality of second redistribution patterns 420 of the second wiring structure 400. For example, the upper package UP may be connected to a plurality of top surface connection pads PAD-U. For example, a plurality of package connection terminals 950 may be arranged between the upper package UP and the plurality of top surface connection pads PAD-U. For example, the plurality of package connection terminals 950 may be attached to a plurality of top surface connection pad layers 430. The plurality of package connection terminals 950 may electrically connect the lower package LP and the upper package UP with each other. In some embodiments, each of the plurality of package connection terminals 950 may be a bump, a solder ball, or the like.

The upper package UP may include a package substrate 700 and an auxiliary semiconductor chip 800 mounted on the package substrate 700. The auxiliary semiconductor chip 800 may include an auxiliary semiconductor substrate 810 having an active surface and an inactive surface opposite to each other, an auxiliary semiconductor device 812 formed on the active surface of the auxiliary semiconductor substrate 810, and a plurality of auxiliary chip pads 820 arranged on a third surface of the auxiliary semiconductor chip 800. The third surface of the auxiliary semiconductor chip 800 and a fourth surface of the auxiliary semiconductor chip 800 may be disposed opposite to each other, and the fourth surface of the auxiliary semiconductor chip 800 means the inactive surface of the auxiliary semiconductor substrate 810. Since the active surface of the auxiliary semiconductor substrate 810 is substantially similar to the third surface of the auxiliary semiconductor chip 800, an illustration separately distinguishing the active surface of the auxiliary semiconductor substrate 810 from the third surface of the auxiliary semiconductor chip 800 may be omitted.

The auxiliary semiconductor chip 800 may be a memory semiconductor chip. For example, the auxiliary semiconductor chip 800 may be a dynamic random access memory (DRAM) chip, a static RAM (SRAM) chip, a flash memory chip, an electrically erasable programmable read-only memory (EEPROM) chip, a phase-change RAM (PRAM) chip, a magnetic RAM (MRAM) chip, or a resistive RAM (RRAM) chip. The auxiliary semiconductor substrate 810 and the auxiliary chip pad 820 may be substantially similar to the semiconductor substrate 110 and the chip pad 120, and thus, detailed descriptions thereof may be omitted. The semiconductor chip 100, the semiconductor substrate 110, the semiconductor device 112, and the chip pad 120 may be referred to as a first semiconductor chip, a first semiconductor substrate, a first semiconductor device, and a first chip pad, or may be referred to as a lower semiconductor chip, a lower semiconductor substrate, a lower semiconductor device, and a lower chip pad, and the auxiliary semiconductor chip 800, the auxiliary semiconductor substrate 810, the auxiliary semiconductor device 812, and the auxiliary chip pad 820 may be referred to as a second semiconductor chip, a second semiconductor substrate, a second semiconductor device, and a second chip pad, or may be referred to as an upper semiconductor chip, an upper semiconductor substrate, an upper semiconductor device, and an upper chip pad.

In some embodiments, the auxiliary semiconductor chip 800 is electrically connected to the package substrate 700 through a plurality of bonding wires 830 connected to the plurality of auxiliary chip pads 820 and may be mounted on the package substrate 700 by using a die attach film (DAF) 840. In some embodiments, the upper package UP may include the plurality of auxiliary semiconductor chips 800 spaced apart from each other in a horizontal direction, or may include the plurality of auxiliary semiconductor chips 800 stacked in a vertical direction. Alternatively, the upper package UP may include the plurality of auxiliary semiconductor chips 800 electrically connected through a through electrode and stacked in a vertical direction. Alternatively, the auxiliary semiconductor chip 800 may be mounted on the package substrate 700 in a flip chip manner.

The package substrate 700 may be a printed circuit board. For example, the package substrate 700 may be a double-sided printed circuit board or a multi-layer printed circuit board. The package substrate 700 may include at least one base insulation layer 710 and a plurality of wiring patterns 720. The plurality of wiring patterns 720 may include a plurality of bottom surface conductive patterns 722, a plurality of top surface conductive patterns 724, and a plurality of via patterns 726. The plurality of bottom surface conductive patterns 722 may be arranged on the bottom surface of the base insulation layer 710, the plurality of top surface conductive patterns 724 may be arranged on the top surface of the base insulation layer 710, and the plurality of via patterns 726 may penetrate the base insulation layer 710 to connect the plurality of bottom surface conductive patterns 722 with the plurality of top surface conductive patterns 724, respectively. The base insulation layer 710 and the wiring pattern 720 may be substantially similar to the expanded base layer 310 and the via structure 320, and thus, a detailed description thereof may be omitted. In FIG. 9, the package substrate 700 includes the base insulation layer 710 of a single layer, but this is only an example and embodiments are not limited thereto. For example, the package substrate 700 may include two or more stacked base insulation layers 710, and may further include conductive patterns arranged between every two adjacent layers of the two or more base insulation layers 710.

In some embodiments, the package substrate 700 may include a solder resist layer 730 arranged on the top and bottom surfaces of the base insulation layer 710. The solder resist layer 730 may include a bottom surface solder resist layer 732 arranged on the bottom surface of the base insulation layer 710 and a top surface solder resist layer 734 arranged on the top surface of the base insulation layer 710. Among the plurality of wiring patterns 720, the plurality of bottom surface conductive patterns 722 may be exposed to the bottom surface of the package substrate 700 without being covered by the bottom surface solder resist layer 732, and among the plurality of wiring patterns 720, the plurality of top surface conductive patterns 724 may be exposed to the top surface of the package substrate 700 without being covered by the top surface solder resist layer 734. For example, the plurality of top surface conductive patterns 724 may be exposed to an outside.

The plurality of package connection terminals 950 may be attached to the plurality of bottom surface conductive patterns 722, and the plurality of bonding wires 830 may be connected to the plurality of top surface conductive patterns 724.

In some embodiments, the upper package UP may further include a package molding layer 890 surrounding the auxiliary semiconductor chip 800 and the plurality of bonding wires 830 on the package substrate 700. For example, the package molding layer 890 may be a molding member that includes an epoxy mold compound (EMC).

While the inventive concepts have been particularly shown and described with reference to embodiments thereof, it will be understood that various changes in form and details may be made therein without departing from the spirit and scope of the following claims.

What is claimed is:

1. A semiconductor package comprising:

a first wiring structure;

a second wiring structure disposed on the first wiring structure;

an expanded layer electrically connecting the first wiring structure and the second wiring structure to each other, and including an expanded base layer and a plurality of via structures;

a semiconductor chip disposed in the expanded layer and between the first wiring structure and the second wiring structure; and a buried capacitor structure comprising:

a plurality of first through-holes spaced apart from each other that penetrate the expanded base layer adjacent to the semiconductor chip, and extend in a first horizontal direction along a side surface of the semiconductor chip; and a plurality of electrode layers disposed on sidewalls of the plurality of first through-holes.

2. The semiconductor package of claim 1, wherein the plurality of first through-holes are arranged away from the semiconductor chip in a second horizontal direction perpendicular to the first horizontal direction, in a plan view, and wherein the plurality of first through-holes are a pair of first through-holes.

3. The semiconductor package of claim 2, wherein
the expanded base layer further includes at least one second through-hole disposed between the pair of first through-holes and spaced apart from the pair of first through-holes, and
the buried capacitor structure further includes at least one dielectric layer disposed in the at least one second through-hole and including a high-k dielectric material.

4. The semiconductor package of claim 3, wherein lengths of the pair of first through-holes and the at least one second through-hole, extending in the first horizontal direction, are the same.

5. The semiconductor package of claim 1, wherein the plurality of electrode layers are conformally disposed on inner sidewalls of the plurality of first through-holes and extend from a top surface portion of the expanded base layer to a bottom surface portion of the expanded base layer.

6. The semiconductor package of claim 5, further comprising a hole plugging material layer covering each of the plurality of electrode layers and made of an insulation material disposed in each of the plurality of first through-holes.

7. The semiconductor package of claim 1, wherein the plurality of electrode layers fill respective ones of the plurality of first through-holes and extend from a top surface portion of the expanded layer to a bottom surface portion of the expanded layer.

8. The semiconductor package of claim 1, further comprising a plurality of capacitor connection structures connected to the plurality of electrode layers that electrically connect the buried capacitor structure and the semiconductor chip to each other.

9. The semiconductor package of claim 8, wherein at least portion of each of the plurality of capacitor connection structures is formed of a portion of the plurality of via structures.

10. The semiconductor package of claim 1, further comprising a plurality of buried capacitor structures including the buried capacitor structure, and the plurality of buried capacitor structures are spaced apart from each other and connected in parallel.

11. A semiconductor package comprising:
a first wiring structure including a plurality of first redistribution patterns and a plurality of first redistribution insulation layers surrounding the plurality of first redistribution patterns;
a second wiring structure disposed on the first wiring structure and including a plurality of second redistribution patterns and a plurality of second redistribution insulation layers surrounding the plurality of second redistribution patterns;
an expanded layer electrically connecting the first wiring structure and the second wiring structure to each other, and including an expanded base layer and a plurality of via structures;
a semiconductor chip disposed in the expanded layer and between the first wiring structure and the second wiring structure; and
a buried capacitor structure embedded in the expanded base layer, wherein
the expanded base layer comprises:
a pair of first through-holes spaced apart from each other; and
at least one second through-hole disposed between the pair of first through-holes and spaced apart from the pair of first through-holes,
each of the pair of first through-holes and the at least one second through-hole extends in a horizontal direction while passing through the expanded base layer adjacent to the semiconductor chip, and
the buried capacitor structure comprises:
a pair of electrode layers disposed on respective sidewalls of the pair of first through-holes;
a hole plugging material layer made of an insulation material that covers each of the pair of electrode layers and is disposed in each of the pair of first through-holes; and
at least one dielectric layer disposed in the at least one second through-hole and including a high-k dielectric material.

12. The semiconductor package of claim 11, wherein
each of the pair of first through-holes and the at least one second through-hole extends in a first horizontal direction along a side surface of the semiconductor chip, and
the pair of first through-holes are arranged away from the semiconductor chip in a second horizontal direction perpendicular to the first horizontal direction.

13. The semiconductor package of claim 12, further comprising a plurality of buried capacitor structures including the buried capacitor structure, and the plurality of buried capacitor structures are arranged spaced apart from each other and are connected in parallel with each other in the first horizontal direction.

14. The semiconductor package of claim 11, wherein each of the electrode layer, the hole plugging material layer, and the dielectric layer extends from a top surface portion of the expanded base layer to a bottom surface portion of the expanded base layer.

15. The semiconductor package of claim 11, wherein the buried capacitor structure is disposed adjacent to a central portion of a side surface of the semiconductor chip, in a plan view.

16. The semiconductor package of claim 11, wherein the buried capacitor structure is disposed adjacent to an edge of the semiconductor chip, in a plan view.

17. The semiconductor package of claim 11, wherein each of an uppermost end portion and a lowermost end portion of the buried capacitor structure is located at a same vertical level as each of a top surface portion and a bottom surface portion of the expanded base layer.

18. A semiconductor package comprising:
a lower package comprising:
a first wiring structure including a plurality of first redistribution patterns and a plurality of first redistribution insulation layers surrounding the plurality of first redistribution patterns;
a second wiring structure disposed on the first wiring structure and including a plurality of second redistribution patterns and a plurality of second redistribution insulation layers surrounding the plurality of second redistribution patterns;
a lower semiconductor chip disposed between the first wiring structure and the second wiring structure;
an expanded layer surrounding the lower semiconductor chip and including an expanded base layer and a plurality of via structures penetrating the expanded base layer to electrically connect the plurality of first redistribution patterns and the plurality of second redistribution patterns to each other; and a buried capacitor structure embedded in the expanded base layer and electrically connected to the lower semiconductor chip; and an upper package attached to the second wiring structure, electrically connected to the plurality of second redistribution patterns, and including an upper semiconductor chip, wherein the expanded base layer comprises:

a pair of first through-holes and at least one second through-hole that penetrate the expanded base layer adjacent to the lower semiconductor chip and respectively extend in a first horizontal direction along a side surface of the lower semiconductor chip, wherein the pair of first through-holes are spaced apart from each other in a second horizontal direction perpendicular to the first horizontal direction, the at least one second through-hole is spaced apart from the pair of first through-holes, and is disposed between the pair of first through-holes, and the buried capacitor structure comprises:

a pair of electrode layers conformally covering sidewalls of the pair of first through-holes;

a hole plugging material layer made of an insulation material that covers each of the pair of electrode layers and fills each of the pair of first through-holes; and at least one dielectric layer filling the at least one second through-hole and including a high-k dielectric material.

19. The semiconductor package of claim 18, wherein a length of each of the pair of first through-holes and the at least one second through-hole, extending in the first horizontal direction, is hundreds of μm, and a thickness of the pair of electrode layers on the sidewalls of the pair of first through-holes is about 5 μm to about 15 μm.

20. The semiconductor package of claim 18, wherein the electrode layers are made of copper or a copper alloy, and the hole plugging material layer comprises a solder resist ink or an epoxy resin.

* * * * *